United States Patent [19]

Potter

[11] 4,306,193
[45] Dec. 15, 1981

[54] COMPARISON CIRCUIT FOR ALIGNMENT APPARATUS

[75] Inventor: Charles W. Potter, Cypress, Tex.

[73] Assignee: Lasertron Company, Houston, Tex.

[21] Appl. No.: 37,129

[22] Filed: May 8, 1979

[51] Int. Cl.³ .............................................. H03K 5/24
[52] U.S. Cl. .................................... 328/146; 307/355; 328/147
[58] Field of Search ............................... 307/146-149, 307/350, 354, 355, 356, 358

[56] References Cited

U.S. PATENT DOCUMENTS 3,470,388 9/1969 Scarpa ................................ 307/355
4,079,250 3/1978 Jeffcoat ........................... 328/147 X Primary Examiner—John Zazworsky
Attorney, Agent, or Firm—David Alan Rose; Murray Robinson; Ned L. Conley

[57] ABSTRACT

A comparison circuit for use in an apparatus including a source of a coherent light beam of low divergence for quickly and simultaneously establishing a plurality of reference lines or planes for use in leveling, squaring, plumbing, and other alignment functions and for controlling the operation of construction equipment is disclosed.

The present invention is a circuit that finds particular utility in automatically adjusting the orientation of the tool. More particularly the present invention is a circuit for comparing the amplitude of a first alternating current signal to the amplitude of a second alternating current signal, such signals being in phase with one another and having the same frequency.

3 Claims, 19 Drawing Figures

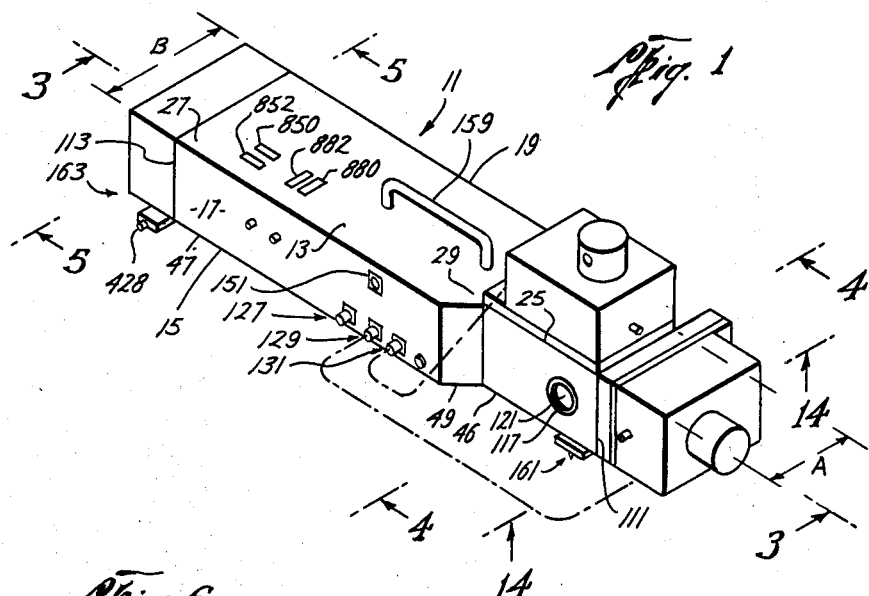
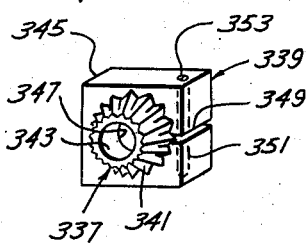
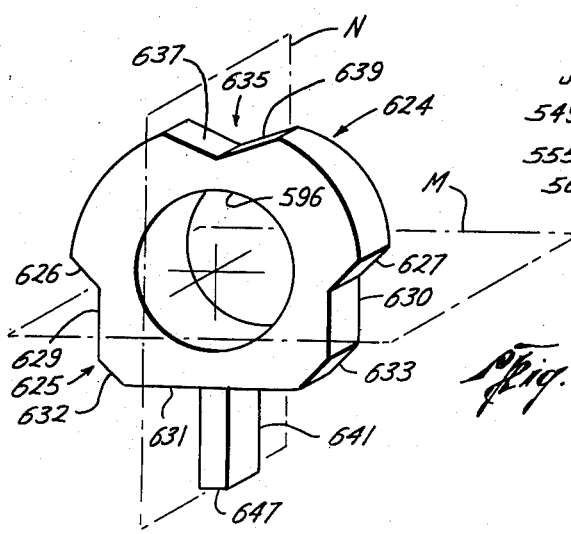

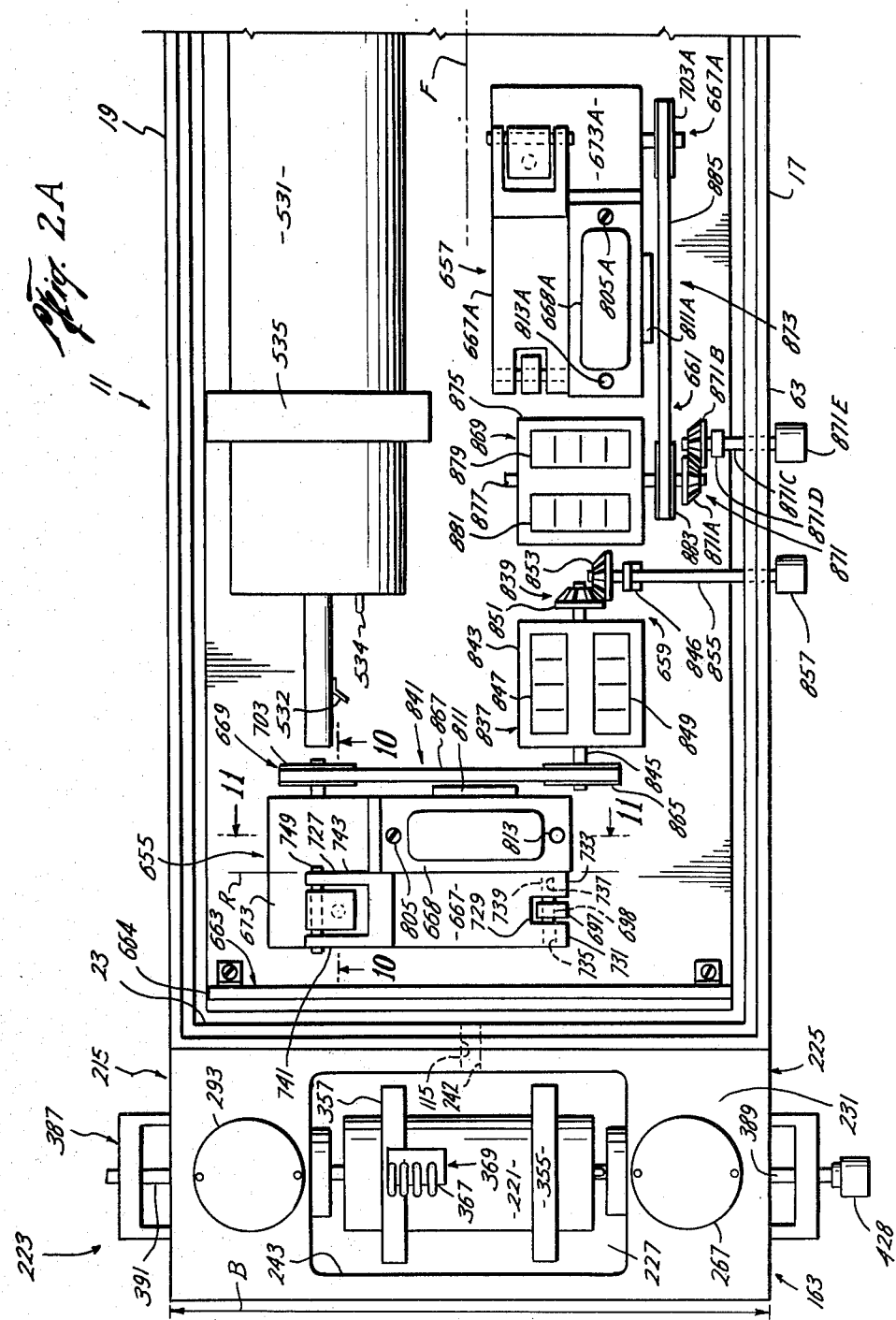

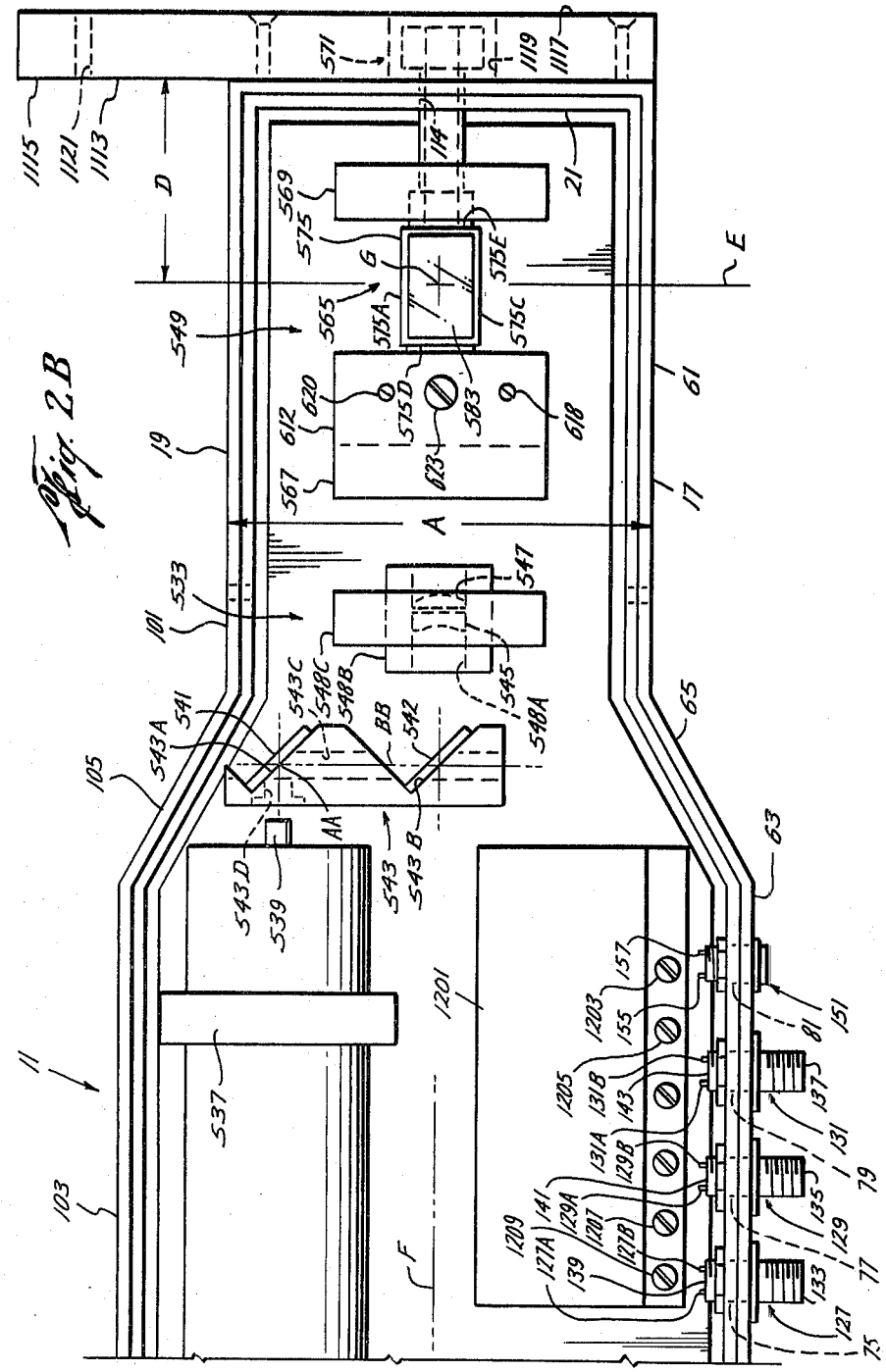

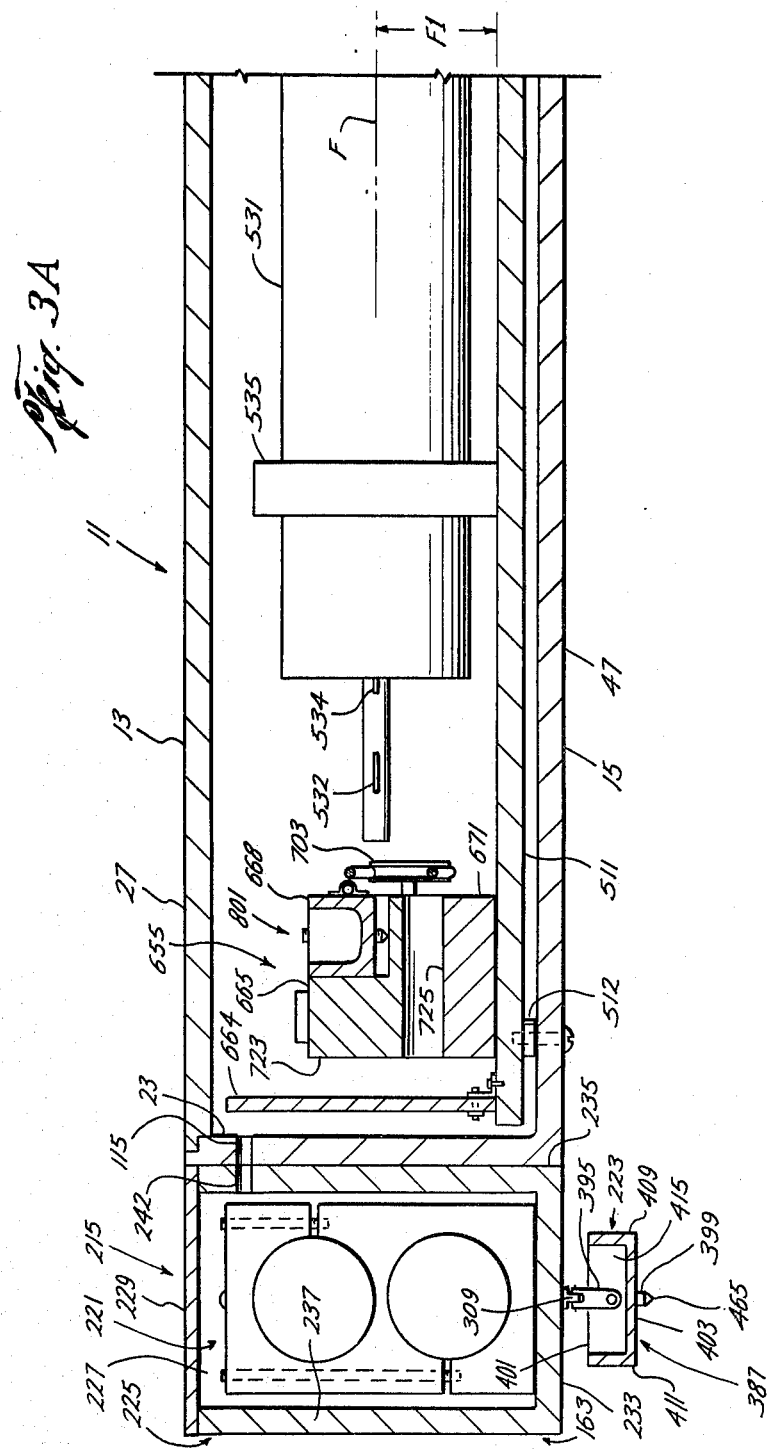

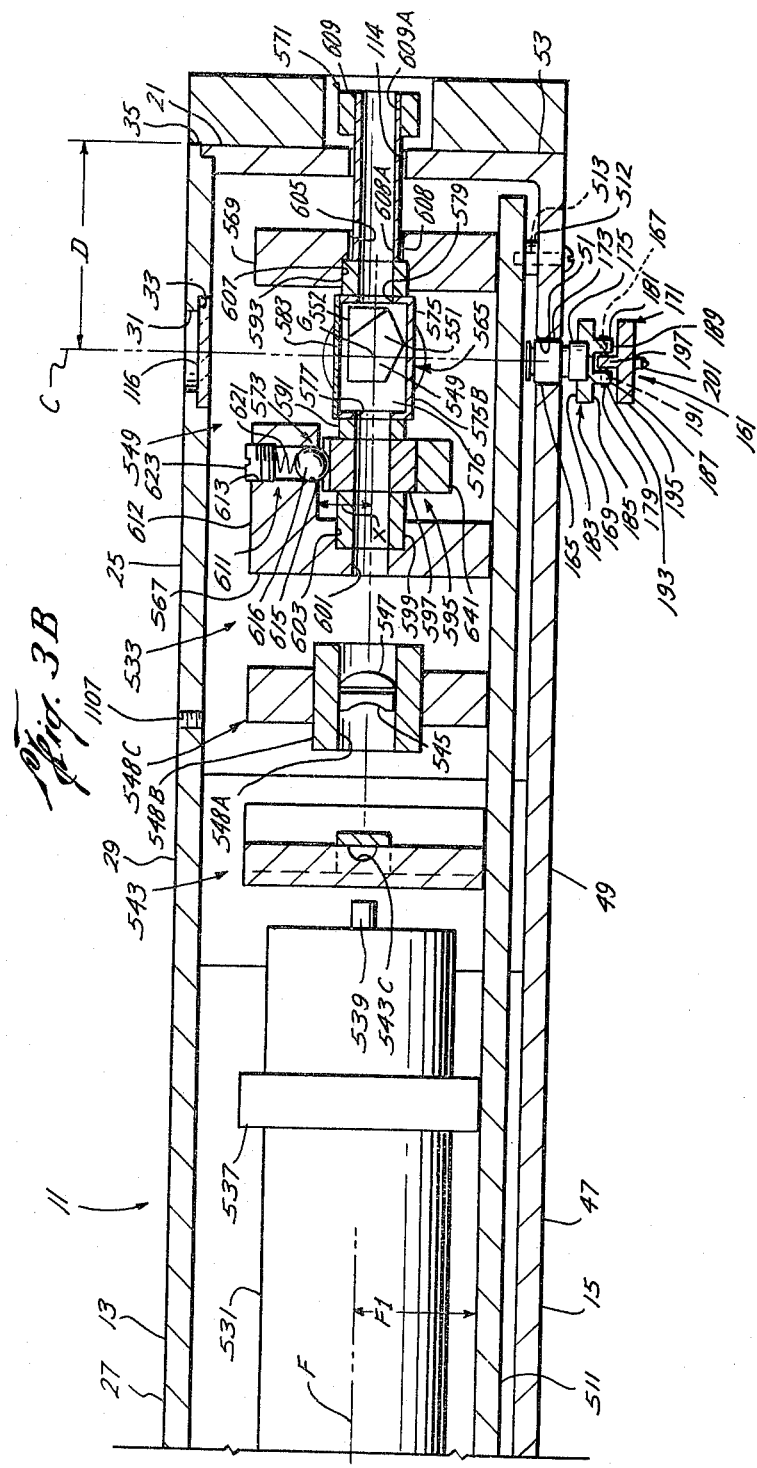

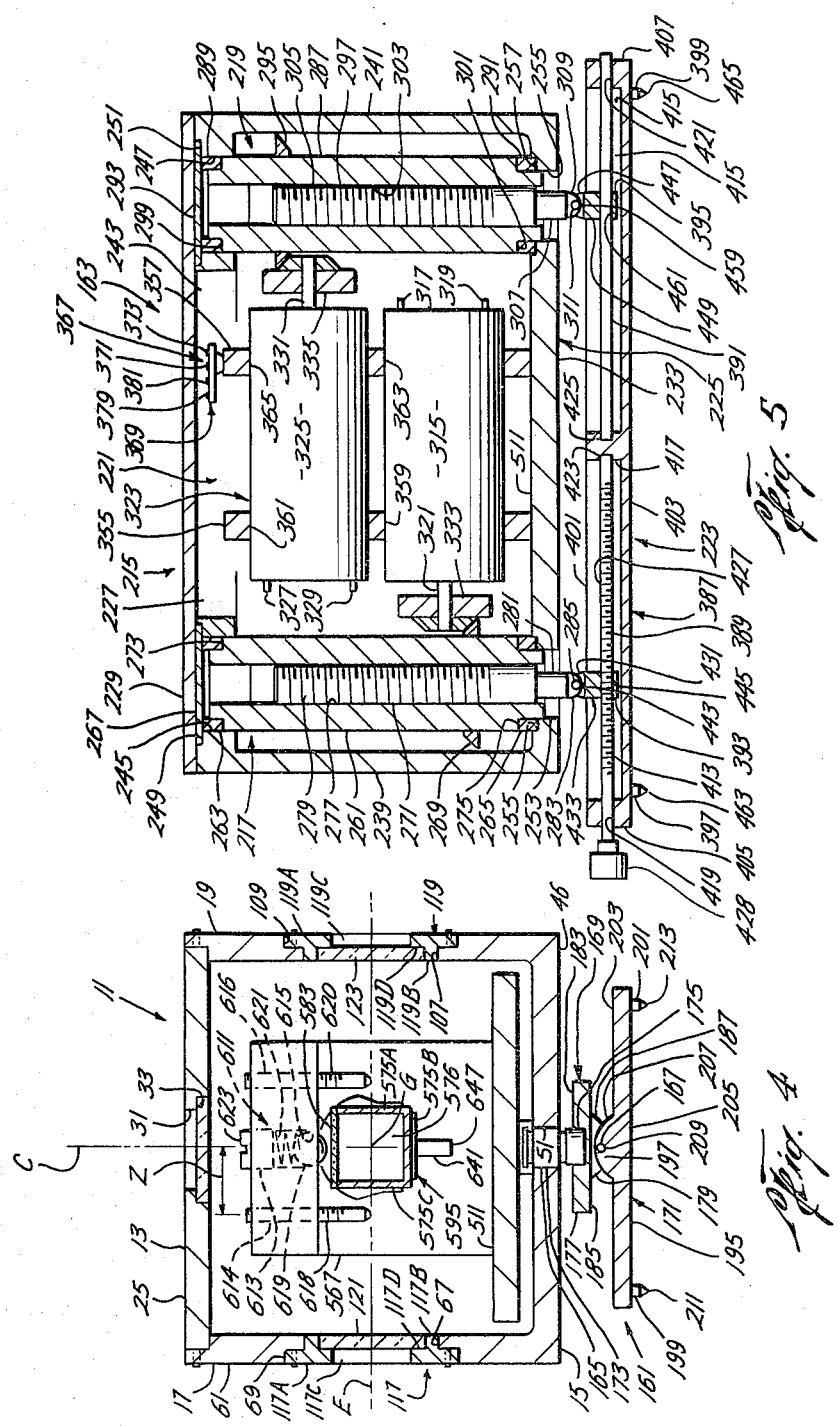

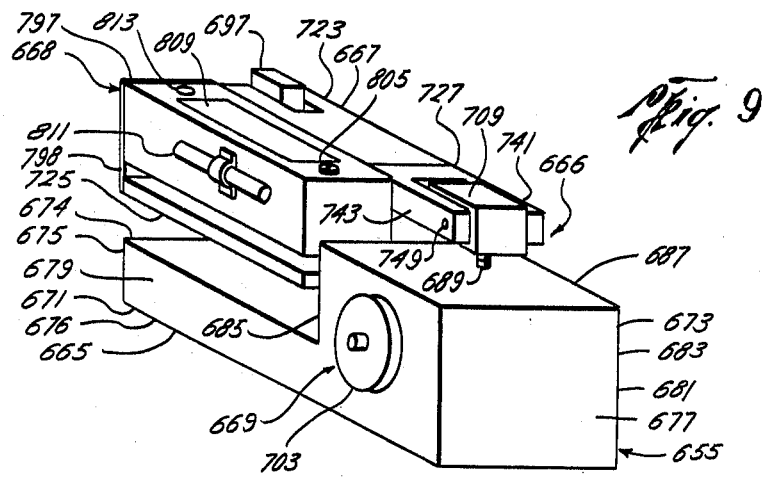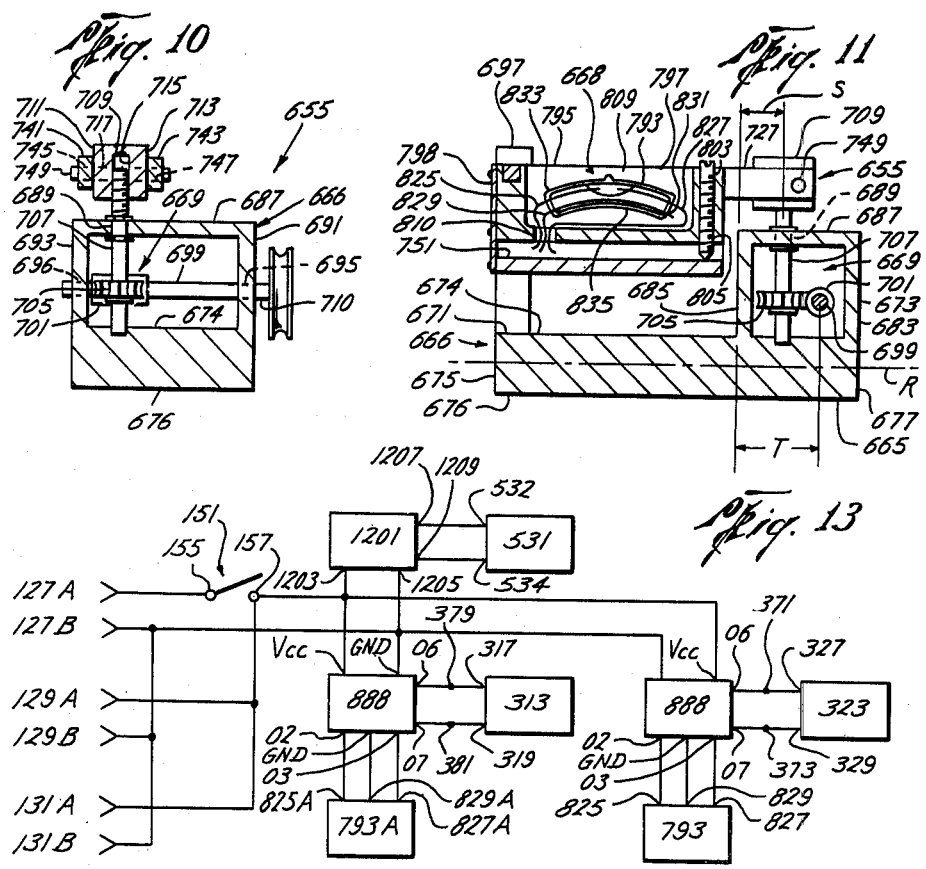

COMPARISON CIRCUIT FOR ALIGNMENT APPARATUS

RELATED APPLICATION

This application is related to U.S. application No. 036,663, filed by Robert K. Genho, Sr. on May 7, 1979 and entitled CONSTRUCTION LASER. This application is directed to an electrical circuit finding particular application in the device of the Genho application.

TECHNICAL FIELD

This present invention relates generally to tools and methods for establishing reference lines and planes for facilitating various alignment operations including leveling, squaring, and plumbing and for automatically controlling the operation of construction equipment such as graders and trenchers, and more specifically to tools for providing beams of light along desired lines or rotating within desired planes, such lines and planes to be used as the aforementioned reference lines and planes and to methods for controlling construction equipment using such beams of light.

BACKGROUND ART

The establishment of desired orientational relationships of surfaces and structure components both to one another and to the vertical and horizontal is an important aspect of the construction industry. This aspect commonly includes the establishment of reference lines and planes having a desired orientation followed by the alignment of surfaces or structure components to such reference lines and planes. Therefore, in fulfilling this aspect of the construction industry, it is desirable to have a tool that quickly, easily and accurately establishes a variety of reference lines and planes in such a way that surfaces and structure components can be quickly, easily and accurately aligned with the reference lines and planes established.

In the prior art, various tools directed toward meeting this need have been developed. These tools include hand-held apparatus such as carpenter's squares, bubble levels and plumb bobs. Although reference lines may be quickly established using such hand tools, the length of such lines are limited by the physical size of such tools. As a result, accurate alignment of surfaces and structure components even slightly remote from such tools is difficult, if not impossible. In addition, the variety of reference lines provided by such tools is often limited: for example, a plumb bob can establish only a vertical reference line; most bubble levels can establish only a vertical reference line, a horizontal reference line and a reference line 45° to the horizontal, most carpenter's squares can establish only a reference line perpendicular to another line.

Also included in the prior art are more complex devices such as theodolites, including the well-known surveyor's transit. Unlike the previously identified hand tools, theodolites are capable of establishing reference lines of relatively substantial length such that surfaces and structure components can be accurately aligned to such reference lines. Both the establishment of the reference lines and the alignment of surfaces and structure components to such reference lines, however, are fairly difficult and time consuming. Establishment of the reference lines includes careful positioning of a tripod and adjustment of several screw-type knobs to establish level. Then, two operators are needed to align objects along the reference line: one operator must be positioned at the theodolite or transit to view the reference line by sighting through the telescope of the theodolite, and a second operator must physically align the object in accordance with the first operator's instructions. Furthermore, theodolites are capable of establishing only a single reference line at a time. Thus, a reference plane can be established only approximately by establishing and marking a series of reference lines a single line at a time. Such marking is commonly accomplished through the use of stakes with string tied between them.

More recently, tools capable of providing optical outputs in the form of beams of light have been developed in the prior art. These tools often have adjustment devices and direction indicators such as level bubble vials and angular graduations so that the orientation of the beam or beams can be set as desired. Furthermore, the beam is generally provided by a laser since laser beams can be produced to have high coherence, low divergence and high intensity over relatively long distances. Thus, these tools offer advantages over theodolites in that they provide a well-defined reference line that can be received and interpreted at relatively large distances from the laser itself. Because of this remote indication capability, alignment of objects with the beam does not require an operator at the laser itself. Instead, a remote operator can align an object with the reference line established by the beam merely by moving the object until the beam strikes the object at the desired location. Furthermore, multiple reference lines having a desired relationship to one another can be established simultaneously using beamsplitters. Similarly, reference planes can be established using rotating reflectors. Various lasers developed heretofore for use in establishing reference lines and planes are shown in U.S. Pat. Nos. 3,528,748 issued Sept. 15, 1970, to Burch et al; 3,588,249 issued June 28, 1971, to Studebaker; 3,813,170 issued May 28, 1974, to Sears; and 3,897,637 issued Aug. 5, 1975, to Genho.

Burch et al shows the use of a double imaging system for aligning a laser beam after it has been focused on a target. Burch also shows the use of photoelectric methods for determining the position of laser beams with respect to a target.

Studebaker shows the use of a laser beam for automatically controlling grading level of an earth grader through the use of photosensitive target in combination with a servomechanism for controlling the flow of hydraulic fluid. The photosensitive target includes two vertically spaced photocells with a neutral zone in the space between the photocells. Studebaker also shows reflecting a vertical laser beam using a rotating penta-prism for estalishing a horizontal reference plane. In addition, Studebaker shows reflecting a horizontal beam using a 45° rotating reflector for establishing a vertical reference plane. Studebaker further shows a means for adjustably mounting a laser in a substantially vertical position. The laser is permanently secured to a tripod by means of a ball-and-socket joint. Level adjustments are made by screw means with bubble vials as a reference. The bubble vials are adjustable with respect to the laser so that a reference plane having a desired angular relationship to the grade can be established by adjusting a micrometer. Fine elevation adjustments are made by means of a rotatable spur gear cooperating with a rack gear.

Sears shows splitting the laser beam using one or more apertured 45° reflectors. One of the resulting beams is used for positioning the laser device over a reference point on the ground. Sears also shows the use of two horizontal reference beams whose angular relationship is fixed by the design of the particular device. In addition, Sears shows gear means for manually adjusting the horizontal beams simultaneously to different directions within a horizontal plane.

Genho shows the use of reflective-transmittive 45° beamsplitters for transmitting either two or three orthagonal beams that can be used for squaring, leveling and plumbing. Genho also shows means for changing the position of one of the beams from horizontal to vertical by rotating the laser housing with respect to an adjustable support means. The support means includes two feet separately, threadedly mounted in a block that is rotatably and translatably attached to the housing. Genho also shows the use of a detachable rotatable reflecting pentaprism for establishing either a horizontal or a vertical reference plane.

While the prior art shows such tools capable of providing simultaneously a plurality of reference lines having a desired relationship to one another and of providing a reference plane having a desired orientation, none of the prior art shows a device that can be placed on any reasonable flat, substantially horizontal surface so as to provide a substantial selectable variety of reference lines and planes without requiring either substantial initial manual adjustment and leveling or substantial releveling and repositioning of the device when changing from one line or plane or set of lines and/or planes to another set of lines and/or planes. Such a device is desirable since it enables the performance of a wide variety of alignment functions and related activities while the device remains accurately positioned over a single reference point without any time consuming readjustments and releveling. Furthermore, such a device is desirable since, by providing a plurality of reference planes, it can be used to control the total operation of a piece of construction equipment.

DISCLOSURE OF THE INVENTION

The present invention is a comparison circuit finding particular utility in a tool capable of producing a plurality of reference planes having a desired relationship to one another without requiring substantial initial adjustment or leveling while assuring accuracy of orientation of the planes to the degree that a piece of construction equipment can be used to perform desired functions without the need of a continuous operator. Furthermore, the tool is capable of providing reference planes and lines in a variety of directions without substantially altering the position of the apparatus thus providing accurate relationships between the various reference lines and planes while the apparatus remains positioned at a single reference point.

The present invention is a circuit that finds particular utility in automatically adjusting the orientation of the tool. More particularly the present invention is a circuit for comparing the amplitude of a first alternating current signal to the amplitude of a second alternating current signal, such signals being in phase with one another and having the same frequency, the circuit including (i) first filter means for rectifying and filtering such first alternating current signal so as to provide a substantially direct current first signal having a voltage level directly proportional to the amplitude of such first alternating current signal; (ii) second filter means for rectifying and filtering such second alternating current signal so as to provide substantially direct current and having a voltage level directly proportional to the amplitude of such second alternating current signal; (iii) first comparison means for providing a first comparison signal, said first comparison signal including a first comparison pulse whenever the amplitude of such first alternating current signal becomes greater than the voltage level of said second filtered signal, each said first comparison pulse beginning at the time such first alternating signal becomes greater than the voltage level of said second filtered signal and ending when said first alternating signal becomes less than the voltage level of said second filtered signal; (iv) second comparison means for providing a second comparison signal, said second comparison signal including a second comparison pulse whenever the amplitude of such second alternating current signal becomes greater than the voltage level of said first filtered signal, each said second comparison pulse beginning at the time such second alternating current becomes greater than the voltage level of said first filtered signal and ending when such second alternating current signal becomes less than the voltage level of said first filtered signal; and (v) output means for providing an output signal having a first value whenever said first comparison pulses are wider than said second comparison pulses, a second value whenever said second comparison pulses are wider than said first comparison pulses and a third value whenever said first comparison pulses have the same width as said second comparison pulses.

BRIEF DESCRIPTION OF THE DRAWINGS

For a further understanding of the nature and objects of the present invention, reference should be had to the following detailed description, taken in conjunction with the accompanying drawings, in which like parts are given like reference numerals and wherein:

FIG. 1 is a pictorial external view of the preferred embodiment of the apparatus of the invention;

FIG. 2, which includes FIGS. 2A and 2B, is a top view of the preferred embodiment of the apparatus of the invention with the top plate of the housing, the cover plate of the rear support mechanism housing and the beacon units removed;

FIG. 3, which includes FIGS. 3A and 3B, is a section of the apparatus of FIG. 1 taken along line 3—3 and with the beacon units removed;

FIG. 4 is a section of the apparatus of FIG. 1 taken along line 4—4 with the beacon units removed;

FIG. 5 is a section of the apparatus of FIG. 1 taken along line 5—5;

FIG. 6 is a detailed pictorial view of the bevel gear unit of a motor unit of the rear support mechanism of the preferred embodiment of the apparatus of the invention;

FIG. 7 is a detailed view of the optical component of the preferred embodiment of the apparatus of the invention;

FIG. 8 is a detailed pictorial view of the detent portion of the locking ring of the preferred embodiment of the apparatus of the invention;

FIG. 9 is a detailed pictorial view of one of the level actuators of the preferred embodiment of the apparatus of the invention;

FIG. 10 is a section of the actuator of FIG. 9 taken along line 10—10 as shown in FIG. 2A;

FIG. 11 is a section of the actuator of FIG. 9 taken along line 11—11 as shown in FIG. 2A;

FIG. 13 is a block diagram illustrating the interconnection wiring of the preferred embodiment of the apparatus of the invention.

BEST MODE FOR CARRYING OUT THE INVENTION

1. Introduction

Figure 12:
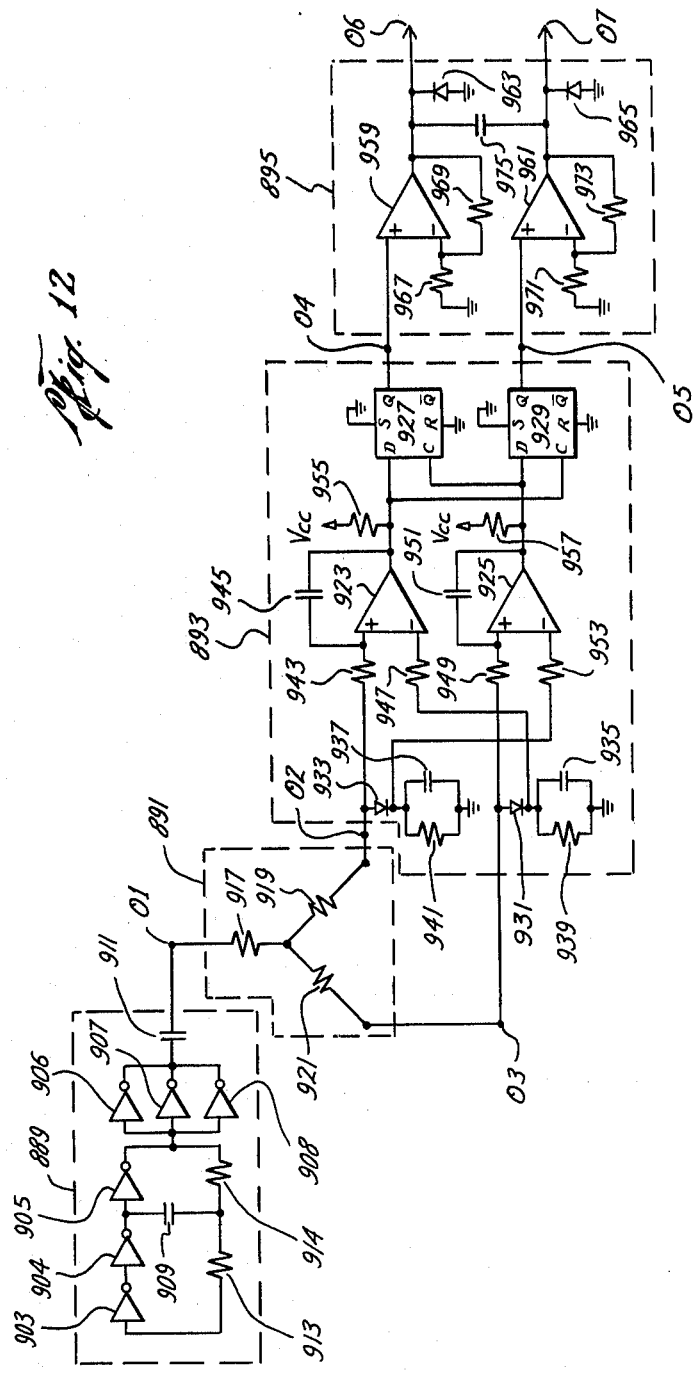
FIG. 12 is a schematic of the motor-drive circuit of the preferred embodiment of the apparatus of the invention.

The preferred embodiment of the circuit of the invention has particular application in an apparatus that includes seven major components: (1) a housing for containing and protecting many of the vital components of the apparatus; (2) a support mechanism, controlled by electric motors, for supporting the housing on a surface such that the orientation of the housing with respect to the surface can be varied; (3) an optical bench disposed within the housing for supporting many of the vital components of the apparatus in a desired orientation with respect to one another; (4) a light source and optics system that provides first and second laser beams that are directed along paths that are perpendicular to one another, the path of the first beam being variable to three discrete directions with respect to the housing while the direction of the path of the second beam is substantially fixed with respect to the housing; (5) a level control mechanism for controlling the orientation of the housing with respect to the surface by controlling movement of the electric motors of the support mechanism; (6) a pair of beacon units supported by the housing along the paths of the first and second beams, the beacons including rotating reflectors for rotating the beams in a pair of perpendicular planes; and (7) a power supply system for supplying power to the light source and optics system; the level control mechanism and the beacon units.

2. Housing

Referring to FIGS. 1-4, the preferred embodiment of the apparatus includes housing 11 comprising top 13, bottom 15, left wall 17, right wall 19, front wall 21 and rear wall 23.

Top 13 has a flat elongate configuration that is symmetrical about an axis and includes (1) rectangular front portion 25 having width A, which may be, for example, 4 inches (10.16 cm.), and a length that is approximately one-fourth of the overall length of top 13; (2) rectangular rear portion 27 having width B, which may be, for example, 6 inches (15.24 cm.), that is visibly greater than width A and a length that is approximately two-thirds of the overall length of top 13; and (3) trapezoidal intermediate portion 29 extending between front portion 25 and rear portion 27, the width of portion 29 varying between width A adjacent front portion 25 and width B adjacent rear portion 27. The overall length of top segment 13 may be, for example, 22 inches (55.88 cm.).

Top plate 13 has a circular passage 31 having counterbore 33 extending through front portion 25. The axis of passage 31 is coincident with axis C which extends perpendicular to and intersects the axis of plate 13 at distance D from front edge 35 of plate 13. Preferably, passage 31 has a diameter of 0.85 inch (2.159 cm.), and counterbore 33 has a diameter of 1 inch (2.54 cm.) and a depth of 0.125 inch (0.3175 cm.).

Bottom 15 has a geometrical and dimensional configuration that is substantially identical to that of top 13. Thus, bottom 15 has front portion 46, rear portion 47, and intermediate portion 49. Bottom 15 has circular passage 51 extending perpendicularly through front portion 46. The axis of passage 51 intersects the axis of bottom 15 the distance D from front edge 53 of bottom 15. Preferably, the diameter of passage 51 is 0.375 inch (0.9525 cm.).

Bottom 15 is spaced below top 13 and is parallel to and aligned with top 13 such that the axes of top 13 and bottom 15 are both within a single plane that is perpendicular to the planes of top 13 and bottom 15 and such that the axis of passage 51 is coaxial with axis C. A preferred spacing between top 13 and bottom 15 is 3.5 inches (8.89 cm.).

Left wall 17 extends perpendicularly between top 13 and bottom 15 such that the top of wall 17 adjoins the left edge of top 13 along the entire length of top 13 and the bottom of wall 17 adjoins the left edge of bottom 15 along the entire length of bottom 15. Because of the varying widths of top 13 and bottom 15, wall 17 will be bent so that wall 17 has front portion 61, rear portion 63, and intermediate portion 65.

Wall 17 has circular passage 67 having counterbore 69 extending perpendicularly through front portion 61. The axis of passage 67 is coincident with axis E which perpendicularly intersects both axis C and the symmetrical axis of left wall 17.

Wall 17 further has circular passages 75, 77, 79, 81 extending perpendicularly through rear portion 63 of wall 17. Passages 75, 77, 79 are positioned proximate to one another toward the front of rear portion 63 and are positioned at equal distances above bottom 15. Passage 81 is positioned above passages 75, 77, 79. Passages 75, 77, 79, 81 have a diameter of 0.85 inch (2.159 cm.).

Right wall 19 extends perpendicularly between top 13 and bottom 15 such that the top of wall 19 abuts the right edge of top 13 along the entire length of top 13 and the bottom of wall 19 abuts the right edge of bottom 15 along the entire length of bottom 15. Because of the varying widths of top 13 and bottom 15, wall 19 will be bent so that wall 19 has front portion 101, rear portion 103 and intermediate portion 105.

Wall 19 has circular passage 107, having counterbore 109, extending perpendicularly through front portion 101. The axis of passage 107 is coincident with axis E.

In accordance with the foregoing description of top 13, bottom 15 and walls 17, 19, it can be seen that plates 13, 15 and walls 17, 19 form a tube having an axis F about which top 13, bottom 15 and walls 17, 19 are symmetrically arranged and having front end 111 formed by the front edges of top 13, bottom 15 and walls 17, 19 and rear end 113 formed by the rear edges of top 13, bottom 15 and walls 17, 19. Front wall 21 is secured to and covers front end 111. Rear wall 22 is secured to and covers rear end 113. Preferably, bottom wall 15, left wall 17, right wall 19, front wall 21 and rear wall 23 are cast in aluminum as a five-sided unit with an open top, all parts being 0.25 inch (0.635 cm.) thick. Top 13 is preferably made from 0.25 inch (0.635 cm.) sheet aluminum and is removably attached to the top of such five-sided unit by means of screws. In this way, access to the inside of housing 11 is provided.

Front plate 21 has passage 114 extending therethrough coaxial with axis F. Rear plate 23 has wire passage 115 extending therethrough.

Furthermore, in accordance with the foregoing description of housing 11, it can be seen that axes C, E and F all perpendicularly intersect one another at point G spaced distance D along axis F from front end 111.

Housing 11 further includes glass disc 116 having a diameter greater than that of passage 31 and less than that of counterbore 33 secured within counterbore 33 using an adhesive such as RTV.

Housing 11 also includes window mounts 117, 119 having disc-shaped portions 117A, 119A and concentric annular flange portions 117B, 119B, respectively. Disc-shaped portions 117A, 119A have diameters less than that of counterbores 69, 109, respectively, and greater than that of passages 67, 107, respectively. Flange portions 117B, 119B have diameters slightly less than passages 67, 107, respectively. Window mounts 117, 119 are mounted on walls 17, 19, respectively, such that disc-shaped portions 117A, 119A are disposed in counterbores 69, 109, respectively, and flange portions 117B, 119B are disposed in passages 67, 107, respectively. Window mounts 117, 119 are secured to walls 17, 19, respectively, by screws extending through disc-shaped portions 117A, 119A and threaded into the bases of counterbores 69, 109.

Window mounts 117, 119 further include passages 117C, 119C extending through disc-shaped portions 117A, 119A, respectively, and concentric therewith. The diameters of passages 117C, 119C are slightly less than the inside diameters of flange portions 117B, 119B, respectively, whereby annular lands 117D, 119D are formed. Window mounts 117, 119 also include glass discs 121, 123, respectively, having diameters intermediate the inside diameter of flange portions 117B, 119B, respectively, and the diameter of passages 117C, 119C, respectively, and secured to bands 117D, 119D by an adhesive such as RTV.

Housing 11 also includes two-pin female connectors 127, 129, 131, having connector portions 133, 135, 137 and terminal lug portions 139, 141, 143, respectively. Connectors 127, 129, 131 are mounted on left wall 17 adjacent passages 75, 77, 79, respectively, such that the terminal lug portions extend into housing 11 and such that the connector portions face outwardly from wall 17. Connectors 127, 129, 131 each have a terminal lug A and a terminal lug B. Preferably, connector portions 133, 135, 137 include means for securely maintaining a connection between the corresponding connectors and a female connector mated thereto. Such means is shown in FIGS. 1 and 2 as externally threaded cylindrical flanges.

Housing 11 additionally includes a single pole, single-throw, key-operated switch 151 having keyhole 153 and terminal lugs 155, 157. Switch 151 is secured within passage 81 such that keyhole 153 faces outwardly from housing 11 and terminal lugs 155, 157 extend into housing 11.

Housing 11 further includes handle 159 secured to rear portion 27 of top 13 along the axis of top 13.

3. Support Mechanism

Referring to FIGS. 1-6, the preferred embodiment of the apparatus includes a support mechanism comprising front support unit 161 and rear support unit 163.

Front support unit 161 includes pivot pins 165, 167, upper pivot block 169 and lower pivot block 171.

Pivot pin 165 has end 173 rotatably secured within passage 51 of bottom 15 of housing 11 and end 175 extending perpendicularly below bottom 15.

Upper pivot block 169 includes body 177 and lugs 179, 181. Body 177 is an elongate right rectangular hexahedron having upper surface 183 and lower surface 185. Body 177 is attached to end 175 of pivot pin 165 at the geometrical center of upper surface 183 such that upper surface 183 is parallel to and spaced slightly below bottom 15 of housing 11. Lugs 179, 181 extend perpendicularly from opposite sides of lower surface 185, both lugs being axially centered with respect to body 177. Lugs 179, 181 have rounded ends 187, 189, respectively, facing away from lower surface 185 and coaxial pin passages 191, 193, respectively, therethrough. The axis of passages 191, 193 is perpendicular to the axis of body 177 and perpendicularly intersects the axis of pivot pin 165.

Lower pivot block 171 includes base 195, lug 197 and feet 199, 201. Base 195 is an elongate right rectangular hexahedron having upper surface 203 and lower surface 205. Lug 197 extends perpendicularly from the geometric center of upper surface 203 and has rounded end 207 facing away from upper surface 203 and pin passage 209 extending therethrough. The axis of passage 209 is perpendicular to the axis of base 195. Lug 197 is disposed between lugs 179, 181 such that pin passage 209 is coaxially aligned with passages 191, 193. Pivot pin 167 extends through passages 191, 209, 193 such that upper pivot block 169 is pivotally attached to lower pivot block 171. Feet 199, 201 have pointed ends 211, 213, respectively, and are fixedly attached to opposite ends of lower surface 205 of base 195 such that ends 211, 213 extend perpendicularly away from surface 205 an equal distance. Preferably, the axes of feet 199, 201 intersect the axis of base 195 at points spaced equally to either side of the axis of base 195.

Preferably the dimensions of the parts of front support unit 161 are such that when base 195 is parallel to bottom 15, the distance from the lower surface of bottom 15 to the tips of feet 199, 201 is 0.75 inches (1.905 cm.).

Referring to FIGS. 2, 3 and 5, rear support unit 163 includes housing unit 215, plunger mechanisms 217, 219, motor unit 221 and base unit 223.

Housing unit 215 includes right rectangular, flat, hexahedral body 225, having chamber 227 therein, and cover plate 229. Body 225 has upper side 231, lower side 233, front side 235, rear side 237, left side 239 and right side 241. Front side 235, having outer periphery geometry substantially identical with that of rear end 113 of housing 11, is attached to rear wall 23 of housing 11 such that front side 235 is aligned with rear end 113. Front side 235 further has wire passage 242 extending therethrough and aligned with passage 115 of rear wall 23. Upper side 231 has rectangular access opening 243 extending therethrough and centered with respect to upper side 231. Upper side 231 also has circular bearing passages 245, 247 extending perpendicularly therethrough between opening 243 and sides 239, 241, respectively. Passages 245, 247 have counterbores 249, 251, respectively, adjacent the outer surface of upper side 231. Lower side 233 has circular bearing passages 253, 255 extending perpendicularly therethrough coaxial with passages 245, 247, respectively, of upper side 231. Passages 253, 255 have counterbores 257, 259, respectively, adjacent the inner surface of lower side 233.

Cover plate 229 has outer periphery geometry substantially identical to upper side 231 of body 225. Cover plate 229 is removably attached to body 225 by screws extending through plate 229 and threaded into upper side 231 such that cover plate 229 is aligned with upper side 231.

Plunger mechanism 217 includes plunger cylinder 261, annular bearings 263, 265, retainer plate 267, annular bevel gear 269 and plunger rod 271. Cylinder 261 has bearing seats 273, 275 at either end and threaded passage 277, preferably having 32 threads per inch (right-handed threads), extending axially therethrough. Cylinder 261 is rotatably mounted within chamber 227 between passages 245 and 253 and is coaxial with passages 245, 253. Cylinder 261 is held in position by bearing 263, which bears between passage 245 and bearing seat 273, and bearing 265, which bears between counterbore 257 of passage 253 and bearing seat 275. The upper surface of bearing 263 is aligned with the base of counterbore 249. Retainer plate 267 is secured with counterbore 249 so as to prevent axial movement of cylinder 261. Bevel gear 269 is fixedly secured to the outer surface of cylinder 261 approximately midway between the inner surface of lower side 233 and the longitudinal center of cylinder 261 such that the teeth of bevel gear 269 face generally upwardly toward upper side 231. Rod 271 has threaded portion 279 threadingly received within passage 277 of cylinder 261, unthreaded portion 281 extending from the lower end of threaded portion 279 and clevis eyelet 283, having pin passage 285, extending from the lower end of unthreaded portion 281. The lowermost end of rod 271 extends through passage 253 such that clevis eyelet 283 is positioned below the lower surface of lower side 233.

Plunger mechanism 219 includes plunger cylinder 287, annular bearings 289, 291, retainer plate 293, annular bevel gear 295 and plunger rod 297. Cylinder 287 has bearing seats 299, 301 at either end and threaded passage 303, preferably having 32 threads per inch (right-hand threads), extending axially therethrough. Cylinder 287 is rotatably mounted parallel to cylinder 261 between and coaxial to passages 247, 255. Cylinder 287 is held in position by bearing 289, which bears between passage 247 and bearing seat 299, and bearing 291, which bears between counterbore 259 of passage 255 and bearing seat 301. The upper surface of bearing 289 is aligned with the base of counterbore 251. Retainer plate 293 is secured within counterbore 251 so as to prevent axial movement of cylinder 287. Bevel gear 295 is fixedly secured to the outer surface of cylinder 287 approximately midway between the inner surface of upper side 231 and the longitudinal center of cylinder 287 such that the teeth of bevel gear 295 face generally downwardly toward lower side 233. Rod 297 has threaded portion 305 threadingly received within passage 303 of cylinder 287, unthreaded portion 307 extending from the lower end of threaded portion 305 and clevis eyelet 309, having pin passage 311, extending from the lower of unthreaded portion 307. The lowermost end of rod 297 extends through passage 255 such that clevis eyelet 309 is positioned below the lower surface of lower side 233.

Motor unit 221 is a system for rotating cylinder 261 in response to a first electrical input signal, the direction of rotation of cylinder 261 being dependent on the polarity of the first electrical input signal, and for rotating cylinder 287 in response to a second electrical input signal, the direction of rotation of cylinder 287 being dependent on the polarity of the second electrical input signal.

In accordance with this desired function, motor unit 221 preferably includes motor/drive unit 313 having cylindrical body 315, input terminals 317, 319 extending from one end of body 315 and output shaft 321 extending coaxially from the other end of body 315; and motor/drive unit 323 having cylindrical body 325, input terminals 327, 329 extending from one end of body 325 and output shaft 331 extending coaxially from the other end of body 325. Motor/drive unit bodies 315, 325 house a dc-actuated electric motor having a motor shaft that rotates in response to an electrical signal applied across the input terminals extending from the body, the direction of rotation of the motor shaft depending directly on the polarity of the signal applied, and the speed of rotation depending on the magnitude of the signal applied. Bodies 315, 325 each may further include reduction gearing connecting the motor shaft to the output shaft such that the output shaft rotates substantially slower than the motor shaft. A motor/drive unit of the preferred type is manufactured by Micromo Electronics, Inc., Cleveland, Ohio and sold as Motor No. 330409 with gear box 03/2-975-1.

Motor unit 221 further includes bevel gear units 333, 335 mounted on shafts 321, 331, respectively, for transmitting torque from output shafts 321, 331, respectively, to gears 269, 295, respectively. Preferably, each of units 333, 335 includes a clutch mechanism for limiting the transmitted torque in order to protect the motor/drive units and/or the threads of the plunger cylinders and rods from damage should jamming occur. In accordance with this object, as shown in FIG. 6, units 333, 335 each include bevel gear 337 securely attached to clutch 339. Gear 337 has teeth 341 designed to mesh with either gear 269 or gear 295, the ratio of number of teeth of gear 337 to number of teeth of gears 269, 295 being 4-to-1. Gear 337 also has shaft passage 343 having a diameter slightly greater than that of output shafts 321, 331 so that shafts 321, 331 can rotate without rotating gear 337 of the respective bevel gear unit. Clutch 339 includes nylon block 345 having shaft passage 347 coaxial with passage 343 and having a diameter slightly less than output shafts 321, 331. Block 345 has split 349 extending radially from passage 347 through the entire thickness of block 345. By virtue of split 349, block 345 can be mounted on one of shafts 321, 331 merely by spreading split 349 so as to open passage 347. Block 345 further has threaded passage 351 perpendicularly intersecting split 349 near the outer periphery of block 345 and opening on one side of block 345. Clutch 339 further includes screw 353 threaded into passage 351 such that screw 353 engages passage 351 on either side of split 349. In accordance with this description, it can be seen that by adjusting screw 353, the tendency of a bevel gear unit to slip with respect to the output shaft on which it is mounted can be adjusted. Preferably, screw 353 should be adjusted such that the bevel gear unit tends to slip when a torque of 45 pounds is applied between the unit and the output shaft on which the unit is mounted.

Motor unit 221 also includes support posts 355, 357 for supporting motor/drive units 313, 323 such that the axes of output shafts 321, 331 are perpendicular to the plunger cylinders and such that the gear of gear unit 333 meshes with gear 269 and the gear of gear unit 335 meshes with gear 295. In accordance with this function, posts 355, 357 are secured to and extend perpendicularly from the upper surface of lower side 233 of housing unit 215. Post 355 has circular mounting holes 359, 361 and post 357 has circular mounting holes 363, 365 coaxial with holes 359, 361, respectively. Body 315 of motor/drive unit 323 is mounted in holes 359, 363.

Holes 359, 361, 363, 365 may be split and posts 355, 357 may include screw means for tightening the split so as to secure motor/drive units 313, 323 with respect to posts 355, 357.

Motor unit 221 further includes terminal units 367, 369 mounted at the top of post 357. Terminal units 367, 369 are for the purpose of providing electrical access to the terminals of motor/drive units 313, 323, respectively. Terminal unit 367 includes terminals posts 371, 373 connected by wires to terminals 327, 329, respectively, of motor/drive unit 323. Terminal unit 369 includes terminal posts 379, 381 connected by wires to terminals 317, 319, respectively, of motor/drive unit 313.

In accordance with the foregoing description of plunger mechanisms 217, 219 and motor unit 221, when a direct current potential is applied between posts 371 and 373 of terminal unit 367, output shaft 331 of motor/drive unit 323 rotates causing cylinder 287 to rotate. For the purposes of this description, it will be understood that when the potential at post 371 is positive with respect to that at post 373 ("positive potential"), output shaft 331 rotates counter-clockwise (viewing shaft 331 from the left in FIG. 5) causing cylinder 287 to rotate clockwise (viewing cylinder 287 from the top in FIG. 5). Thus, when the potential at post 371 is negative with respect to that at post 373 ("negative potential"), output shaft 331 will rotate clockwise and cylinder 287 will rotate counterclockwise. Similarly, when a direct current potential is applied between posts 379, 381 of terminal 369, output shaft 321 of motor/drive unit 313 rotates causing cylinder 261 to rotate. For the purposes of this description, it will be understood that when the potential of post 381 is positive with respect to that at post 379 ("positive potential"), output shaft 321 rotates counter-clockwise (viewing shaft 321 from the left in FIG. 5) causing cylinder 261 to rotate clockwise (viewing cylinder 261 from the top in FIG. 5). Thus, when the potential of post 381 is negative with respect to that at post 379 ("negative potential"), output shaft 321 will rotate clockwise and cylinder 261 will rotate counterclockwise.

Base unit 223 includes block 387, control shaft 389, guide shaft 391, control clevis 393, guide clevis 395 and feet 397, 399.

Block 387 has the general configuration of an elongate right rectangular hexahedron and has upper side 401, lower side 403, left side 405, right side, 407, front side 409 and rear side 411. Block 387 further includes rectangular cross section channels 413, 415 of equal length opening at upper side 401 and separated at the center of block 387 by rib 417. Block 387 also has shaft passage 419 extending perpendicular to left side 405 from left side 405 to channel 413 and shaft passage 421 extending coaxial to passage 419 from right side 407 to channel 415. Block 387 additionally includes blind holes 423, 425 extending into rib 417 adjacent channels 413, 415, respectively, coaxial to passages 419, 421.

Control shaft 389 includes shaft portion 427 and knob 428. Shaft 389 is rotatably secured within block 387 such that shaft portion 427 extends through passage 419 and into blind hole 423 and knob 428 is positioned adjacent, but not touching, left side 405. The length of shaft portion 427 extending through channel 413 is right-hand threaded, preferably 20 threads per inch.

Guide shaft 391 is secured within block 387 such that it extends through passage 421 and into blind hole 425.

Control clevis 393 connects between clevis eyelet 283 of plunger mechanism 217 and the threaded portion of control shaft 389. Thus control clevis 393 includes clevis yoke portion 431 for connecting to clevis eyelet 283 and clevis eyelet portion 433 for connecting the control shaft 389. Yoke portion 431 includes arms positioned on either side of eyelet 283 and passages aligned with pin passage 285 of eyelet 283. Control clevis 393 further includes pin 443 secured within the passages of yoke portion 431 and passage 285 such that eyelet 283 is rotatable with respect to control clevis 393. Eyelet portion 433 includes threaded passage 445 extending perpendicular to passage 285 and within which the threaded portion of control shaft 389 is threadedly received.

Guide clevis 395 connects between clevis eyelet 309 of plunger mechanism 219 and guide shaft 391 and includes clevis yoke portion 447 and clevis eyelet portion 449. Yoke portion 447 includes arms positioned on either side of eyelet 309 and passages aligned with pin passage 311 of eyelet 309. Guide clevis 395 further includes pin 459 secured within the passages of yoke portion 447 and passage 311 such that eyelet 309 is rotatable with respect to guide clevis 395. Eyelet portion 449 includes passage 461 extending perpendicular to passages 455, 311, 457 and within which the portion of guide shaft 391 extending through channel 415 is telescopically received. The respective diameters of shaft 391 and passage 461 should be such that clevis 305 slides freely over shaft 391 without substantial play.

Feet 397, 399 have pointed ends 463, 465, respectively, and are fixedly attached to opposite ends of the lower surface of lower side 403 of block 387 such that ends 463, 465 extend an equal distance perpendicularly away from the lower surface of lower side 403.

In operating the support mechanism of the apparatus, the support mechanism is positioned with respect to a substantially planar fixedly oriented support surface such that the pointed ends of feet 199, 201, 397, 399 contact the support surface whereby housing 11 is supported above the support surface. Lower pivot block 171 of front support unit 161 is oriented such that its axis is substantially parallel to the axis of block 387 of base unit 223 of rear support unit 163 by rotating block 171 on pivot pin 165. With housing 11 supported by the support mechanism in such a manner, the direction and slope of axes E and F can be varied without moving the feet with respect to the support surface, the direction of an axis being defined as the orientation of the horizontal component of the axis and the slope of an axis being defined as the degree of deviation of the axis from the horizontal. For purposes of this description, the slope of axis E ("E") is positive when axis E is inclined upwardly moving from left wall 17 to right wall 19 of housing 11 and negative when axis E is inclined downwardly moving from left wall 17 to right wall 19; and the slope of axis F ("SF") is positive when axis F is inclined upwardly moving from the rear to the front of housing 11 and negative when axis F is inclined downwardly moving from the rear to the front of housing 11.

Thus, when knob 428 of control shaft 389 is rotated, control clevis 393 moves axially along shaft portion 427 of control shaft 389 by action of the threads of control shaft 389 and threaded passage 445 of control clevis 393. Such movement of control clevis 393 will force the rear of housing 11, which is connected to clevis 393 through plunger rod 271, cylinder 261 and housing unit 215, to move in a direction parallel to the axis of base unit 223 of rear support unit 163 while guide clevis 395 slides along guide shaft 391 and the front end of housing 11 rotates on pivot pin 165. As a result, axes E and F will rotate generally about axis C whereby the direction of the horizontal components of axes E and F will vary. More specifically, when knob 428 is rotated clockwise (viewing knob 428 from the left in FIG. 5), axes E and F will rotate counterclockwise about axis C (viewing axis C from above housing 11) and when knob 428 is rotated counterclockwise, axes E and F will rotate clockwise about axis C.

The slopes of axes E and F are varied by applying an electrical potential to either or both of terminal units 367, 369. As described supra, application of electrical potential to terminal units 367, 369 causes cylinders 287, 261, respectively, to rotate, the direction of rotation of cylinders 287, 261 being dependent on the polarity of the potential at units 367, 369, respectively. The connection of plunger rods 271, 297 to base unit 223, however, prevents rotation of plunger rods 271, 297 about their respective axes. As a result, rotation of cylinders 261, 287 will cause plunger rods 271, 297 to move into and out of cylinders 261, 287, respectively. Such movement of plunger rods 271, 297 will cause housing 11 to move with respect to base unit 223, and because the position of base unit 223 is largely fixed with respect to the support surface, will cause the orientation of housing 11 to vary with respect to the support surfaces as housing 11 rotates on feet 199, 201 and/or pivot pin 167 of front support unit 161. Furthermore, because the support surface is fixed with respect to the horizontal, rotation of either or both of cylinders 261, 287 will cause either or both SE and SF to vary. The general relationship of the potentials applied at terminal units 367, 369 to changes in SE and SF are set forth in Table 1 in which "P369" is the polarity of the potential at unit 369; P367" is the polarity of the potential at unit 367; "0" is no potential (0 volts); "+" is positive potential; "−" is negative potential; "R" is the relationship of the magnitude of the potential at unit 369 to the magnitude of the potential at unit 367; "X" indicates that the polarities themselves govern the relationship; "=" indicates that the magnitude of the potential at unit 369 is equal to that at unit 367; " " indicates that the magnitude of the potential at unit 369 is greater than that at unit 367; " " indicates that the magnitude of the potential at unit 369 is less than that at unit 367; "NC" indicates no change in slope; "decrease" indicates decreasing slope; and "increase" indicates increasing slope.

TABLE 1

| P369 | P367 | R | SE | SF |
|---|---|---|---|---|
| 0 | 0 | X | NC | NC |
| 0 | + | X | decrease | increase |
| 0 | − | X | increase | decrease |
| + | 0 | X | increase | increase |
| + | + | = | NC | increase |
| + | + |  | decrease | increase |
| + | + |  | increase | increase |
| + | − | = | increase | NC |
| + | − |  | increase | increase |
| + | − |  | increase | decrease |
| − | 0 | X | decrease | decrease |
| − | + | = | decrease | NC |
| − | + |  | decrease | decrease |
| − | + |  | decrease | increase |
| − | − | = | NC | decrease |
| − | − |  | decrease | decrease |
| − | − |  | increase | decrease |

It should be noted that Table 1 is based on the assumption that each motor/drive unit-plunger mechanism combination have identical electrical input versus mechanical output characteristics and that the rate of movement of a plunger rod into and out of a cylinder is linearly dependent on the magnitude of the potential applied to the respective terminal units. Because this assumption can only be approximately fulfilled in most instances, Table 1 is accurate only as a general guide for understanding the operation of the rear support mechanism.

4. Optical Bench

Referring to FIGS. 2 and 3, the preferred embodiment of the apparatus of the invention includes optical bench 511 for supporting various of the components of the apparatus. Bench 511 is a flat piece of material, preferably 0.25 inch (0.635 cm.) thick sheet aluminum, supported parallel to and slightly above bottom plate 15 of housing 11 by cylindrical, tubular spacers 512 disposed between the upper surface of bottom 15 and the lower surface of bench 511 such that the upper surface of bench 511 is distance F1 below axis F. Bench 511 is secured to bottom 15 by screws 513 extending through bottom 15 and spacers 512 and threaded into bench 511. Preferably, bench 511 has a geometrical configuration substantially similar to, but with slightly smaller dimensions than, bottom 15 such that the outer periphery of bench 511 corresponds with the inner walls of housing 11.

5. Level Control Mechanism

Bench 511 further supports a level control mechanism which controls the orientational relationship of housing 11 to the support surface by applying varying potential to terminal units 367, 369 of the support mechanism. The level control mechanism includes level actuators 655, 657, actuator drive and indication devices 659, 661, and level control circuitry 663 mounted on circuit board 664. Each level actuator includes (1) a transducer having an axis, the transducer providing an output of electrical significance that varies according to the slope of the axis with respect to the horizontal and (2) support means for supporting the transducer on bench 511 such that the slope of the axis of the transducer with respect to bench 511 can be varied. Each actuator drive and indication device includes (1) means for driving the support means of one of the level actuators so as to cause such actuators to vary the slope of the axis of its transducer with respect to bench 511 and (2) indicator means for indicating the slope of the axis of the transducer of the actuators with respect to bench 511. Circuitry 663 applies potential to terminal units 367, 369, the potential applied being dependent on the slope of the axes of the level actuator transducers with respect to the horizontal.

Referring to FIGS. 9–11, level actuator 655 includes support mechanism 666 and transducer 668. Support mechanism 666 includes base unit 665, transducer support unit 667 and slope adjust mechanism 669.

Base unit 665 includes flat, rectangular platform 671 and mechanism housing 673. Platform 671 has an axis R and has parallel upper and lower surfaces 674, 676, respectively, ends 675, 677 and sides 679, 681. Platform 671 is secured to the rear of bench 511 such that lower surface 676 of platform 671 rests on the upper surface of bench 511. Platform 671 is positioned between tube 531 of optics system 533 and the rear of bench 511 with axis R oriented substantially parallel to axis E.

Housing 673 includes sidewall 683 adjoining end 677 of platform 671 and extending perpendicularly therefrom; sidewall 685 disposed parallel to sidewall 683 and extending from platform 671 along a line spaced toward the center of platform 671 from end 677; and top 687 extending between sidewalls 683, 685 and disposed parallel to platform 671. Top 687 has circular aperture 689 therethrough, the axis of aperture 689 being spaced approximately ¼ of the distance from side 679 to side 681 of platform 671 and a distance S from sidewall 685. Housing 673 further includes end plates 691, 693 removably secured to sidewalls 683, 685 and top 687 adjacent sides 679, 681, respectively, of platform 671. End plates 691, 693 have coaxial circular apertures 695, 696, respectively, therethrough, which are coaxial when plates 691, 693 are secured as noted, the axis of apertures 695, 696 being perpendicular to axis R and being spaced a distance T, which is greater than distance S, from sidewall 685. The actual difference between distances S and T will correspond to the design of mechanism 669, discussed infra.

Base unit 665 further includes support post 697 extending perpendicularly from platform 671 adjacent end 675 and positioned such that a line in a plane parallel to bench 511 and connecting the axis of post 697 and the axis of aperture 689 is parallel to axis R. Post 697 has unthreaded circular cross-section passage 698 (See FIG. 2A) extending therethrough, the axis of passage 698 extending perpendicular to axis R and spaced distance V (not shown) from upper surface 674 of platform 671. Distance V is substantially greater than the distance top 687 of housing 673 is spaced from platform 671.

Adjust mechanism 669 includes worm shaft 699, worm gear 701, sprocket 703 (see FIG. 3A), spur gear 705, spur shaft 707, and connector block 709. Worm shaft 699 is rotatably secured in apertures 695, 696 such that end 710 of shaft 699 extends outside of housing of 673 and such that axial movement of shaft 699 is prevented. Sprocket 703 is fixedly attached to end 710 of shaft 699. Worm gear 701 is fixedly secured to shaft 699 adjacent the axis of aperture 689 of top 687. Spur shaft 707 is rotatably secured in aperture 689 such that axial movement of shaft 707 is prevented and such that the axis of shaft 707 is perpendicular to bench 511. Spur gear 705 is fixedly secured to the end of spur shaft 707 inside housing 673 so as to mesh with worm gear 701. The end of spur shaft 707 outside housing 673 is threaded (righthanded).

In accordance with the description of mechanism 669 described thus far, rotation of sprocket 703 will cause spur shaft 707 to rotate. The relation of the directions of rotation depends on the direction of the helix of worm gear 701. For purposes of understanding the overall operation of the grade control mechanism, it will be understood that worm gear 701 is right-handed whereby clockwise rotation of sprocket 703 (viewing sprocket 103 from the right of FIG. 10) will result in counterclockwise rotation of spur shaft 707 (viewing spur shaft 707 from the top of FIG. 10) and counterclockwise rotation of sprocket 703 will result in clockwise rotation of spur shaft 707.

Connector block 709 has parallel sides 711, 713, threaded passage 715 and unthreaded passage 717. The axis of threaded passage 715 is midway between sides 711, 713. Passage 717 extends perpendicular to passage 715 from side 711 to side 713. Passage 717 does not intersect passage 715. The threaded end of spur shaft 707 is threaded into passage 715 such that passage 717 can be positioned distance V above upper surface 674 of platform 671. The length of shaft 707, the length of the threaded portion of shaft 707 and the depth of threaded passage 715 should be such that when passage 717 is positioned distance V above platform 671, shaft 707 can be threaded both into and out of passage 715 a substantial amount without either tightening the connection of block 709 to shaft 707 or breaking the connection of block 709 to shaft 707.

Transducer support unit 667 includes block 723, with platform 725 extending therefrom (see FIG. 3A), and clevis yoke 727. Block 723 has notch 729 (see FIG. 2A) at one end defining parallel arms 731, 733. Arms 731, 733 have coaxial pin passages 735, 737, respectively, therethrough. Notch 729 is disposed adjacent post 697 such that arms 731, 733 are positioned on either side of post 697 and passages 735, 737 are aligned with passage 698 of post 697 whereby the axes of passages 735, 737 are perpendicular to axis R. Block 723 is rotatably secured to post 697 by pivot pin 739 extending through passages 735, 698, 737. Thus, the axis of pivot pin will be perpendicular to axis R.

Clevis yoke 727 is fixedly connected to the end of block 723 opposite notch 729 such that arms 741, 743 of clevis 727 extend perpendicularly away from block 723. Arms 741, 743 include coaxial pin passages 745, 747, respectively, (see FIG. 10) therethrough, the axis of passages 745, 747 being parallel to that of passages 735, 737. Clevis 727 is positioned adjacent block 709 such that arms 741, 743 are positioned adjacent sides 711, 713, respectively, of block 709, and such that passages 745, 747 are aligned with passage 717 of block 709. Clevis 727 is rotatably connected to block 709 by pin 749 extending through passages 745, 717, 747.

Platform 725 has an upper surface 751 which is substantially parallel to the plane including the axes of ins 739, 749.

According to the operation of support mechanism 666 as described, rotation of sprocket 703 will cause support unit 667 to rotate about pin 739. Because the axis of pin 739 is perpendicular to axis R, the axis of rotation of support unit 667 will be perpendicular to axis R. In particular, clockwise rotation of sprocket 703, viewed from the right of FIG. 10, will result in counterclockwise rotation of unit 667, viewed from the top of FIG. 10, about pin 739 and counterclockwise rotation of sprocket 703 will result in clockwise rotation of unit 667. Such rotation will cause the slope of surface 751 to vary with respect to bench 511. The dimensions of the various parts of base unit 665, support unit 667 and mechanism 669 should be such that unit 667 can be rotated 15 degrees of slope (100% equals 90 degrees from horizontal) in either direction form the position wherein surface 751 is parallel to bench 511.

Transducer 668 preferably includes gravity-sensing electrolytic potentiometer 793 mounted in potentiometer casing 795 (see FIG. 11).

Casing 795 includes elongate casing block 797 having a length substantially equal to that of block 723 and width substantially equal to that of platform 725. The height of casing block 797 is substantially less than the distance from the upper surface of platform 725 to the top of block 723. Casing block 797 is positioned adjacent block 723 and spaced above platform 725. Block 797 is secured in this position by hinge 798, preferably comprising a flat, thin piece of stainless steel, attached between one end of block 797 and the end of platform 725 opposite housing 673 such that the axis of casing block 797 is parallel to axis R. Because of the space between the lower surface of casing block 797 and the upper surface of platform 725, casing block 797 can be rotated with respect to support unit 667 by bending hinge 798.

Casing 797 further includes adjustment mechanism 801 (see FIG. 3A) for adjusting the orientation of casing block 797 with respect to support unit 667. Mechanism 801 includes threaded set screw passage 803 extending through the end of casing block 797 opposite that to which hinge 798 is attached, and set screw 805 threaded into passage 803 such that the lower end of screw 805 contacts the upper surface of platform 725. Thus, as set screw 805 is theaded into or out of passage 803, casing block 797 will rotate with respect to support unit 667 on hinge 798.

Casing 795 further includes channel 809 cut into the upper surface of casing block 797. Channel 809 has an axis parallel to the axis of casing block 797. Casing 795 also has terminal passage 810 extending through casing block 797 from the bottom of channel 809 to the lower surface of casing block 797.

In the preferred embodiment, potentiometer 793 is a commercially available device consisting of a sealed, curve glass tube partially filled with a liquid and having three electrodes, two electrodes being arm electrodes and one being a common electrode. Such a potentiometer, shown generally in FIG. 11 as including tube 823, end electrode terminals 825, 827 and common electrode terminals 829, 831 may be purchased from Frederick Co., Huntington Valley, Pa. In order to understand the operation of potentiometer 793, it should be recognized that tube 823 has an axial plane of symmetry which is intersected by tube 823 along convex line 833 and along concave line 835. In addition, line N is defined as a straight line connecting the centers of the ends of tube 823. According to the operation of potentiometer 793, when tube 823 is positioned such that convex line 833 is positioned above concave line 835 and such that line N is horizontal, the resistance between terminals 825 and 829 ("first resistance") and the resistance between terminals 827 and 831 ("second resistance") are equal. As tube 823 is moved so that line N is angularly deflected from the horizontal such that terminal 825 is positioned below terminal 827, the first resistance becomes less than the second resistance. As tube 823 is moved so that line N is angularly deflected from the horizontal such that terminal 825 is positioned above terminal 827, the first resistance becomes greater than the second resistance.

Potentiometer 793 is securely mounted in channel 809 of casing 797 using RTV potting with convex line 833 facing generally upwardly, and such that line N is parallel to the axis of casing block 797 whereby line N will be parallel to axis R.

Transducer 668 may further include temperature controlling apparatus for maintaining the potentiometer at a fairly constant temperature in accordance with manufacturer's specifications. As shown in FIGS. 2A and 9, such apparatus may include heater 811 secured to casing 797 and thermocouple 813 mounted in casing 797. Heater 811 and thermocouple 813 are connected to a conventional circuit such that a current is supplied to heater 811 in accordance with the current generated by thermocouple 813.

Level actuator 657 is substantially identical to actuator 655 and reference should be had to the detailed description of actuator 655 for an understanding of actuator 657. Actuator 657 differs from actuator 655 only with respect to the position of actuator 657 on bench 511. In order to describe this difference, pertinent parts of actuator 657 are identified in FIGS. 2 and 3 with the reference numbers used to identify the corresponding parts of actuator 655 with the letter "A" added. In accordance with this identification method, platform 671A of actuator 657 is secured to bench 511 such that lower surface 676A of platform 671A fully juxtaposes the upper surface of bench 511. Platform 671A is positioned adjacent the left side of bench 511 about midway along the length of side 525 such that the axis of platform 671A that corresponds to axis R of platform 671 is parallel to axis F.

In accordance with the description of actuators 655, 657, it can be seen that transducers 668, 668A have axes corresponding to the axis of casing blocks 797, 797A, respectively, and that transducers 668, 668A provide outputs of electrical significance, i.e., the relationship of the first resistance to the second resistance, that varies according to the slope of the axis of transducers 668, 668A to the horizontal. Furthermore, it can be seen that the slope of the axis of transducers 668, 668A can be varied by rotation of sprockets 703, 703A of support units 667, 667A. for the purposes of this description, it will be understood that the slope of the axis of a transducer is "level" when such axis is parallel to the horizontal plane; that the slope of the axis of transducer 668 ("S668") when terminal 825 is positioned above terminal 829 and the slope of the axis of transducer 668A ("S668A") is "negative" when terminal 825A is positioned above terminal 829A; and that S668 is "positive" when terminal 825 is positioned below terminal 829 and S668A is "positive" when terminal 825A is positioned below terminal 829A. Thus, when a transducer is level, the first resistance and the second resistance of that transducer are equal; when the slope of the axis of a transducer is negative, the first resistance of that transducer is greater than the second resistance of that transducer; and when the slope of the axis if a transducer is positive, the first resistance of that transducer is less than the second resistance of that transducer.

It should be noted that the axis of transducer 668 moves in a plane parallel to that in which axis E moves and the axis of transducer 668A moves in a plane parallel to that in which axis F moves. Therefore, the above-described sign conventions for S668, S668A correspond to those for SE, SF respectively.

Actuator drive and indication device 659 includes indicator unit 837, knob drive mechanism 839, and sprocket drive mechanism 841 (see FIG. 2A).

Indicator unit 837 is a commercially-available mechanical counter unit that provides a digital readout based on the rotation of a shaft. In the preferred embodiment, unit 837 has casing 843 with drive shaft 845 extending from opposite ends of casing 843. Furthermore, unit 837 preferably has separate indicator scales 847, 849. According to the operation of such a unit, indicator unit 837 has a zero reading at which both scales 847, 849 have a zero readout. If shaft 845 is rotated clockwise (viewing shaft 845 from the right of FIG. 2), scale 847 will count up from zero while scale 849 is covered with a shutter. If shaft 845 is then rotated counterclockwise, scale 847 will count down to zero at which time, with further counterclockwise rotation of shaft 845, scale 847 will be covered with a shutter, the shutter on scale 849 will open and scale 849 will count up. If shaft 845 is then rotated clockwise, scale 849 will count down until zero is reached. Such an indicator unit is available from Durant.

Unit 837 is secured to bench 511 adjacent the left edge of bench 511 such that scales 847, 849 face upwardly and with shaft 845 oriented substantially parallel to axis F. The end of shaft 845 extending toward the rear edge of bench 511 should be aligned with sprocket 703 of actuator 655.

Knob drive mechanism 839 includes 1:1 right angle turn bevel gears 851, 853, shaft 855, shaft support 846 and knob 857. Gear 851 is secured to shaft 845 of unit 837 with gear teeth 854 of gear 851 facing away from unit 837. Shaft 855 extends through shaft support 846, which is attached to bench 511, and left wall 17 of housing 11 and is rotatably secured therein such that the axis of shaft 855 perpendicularly intersects the axis of shaft 845. Gear 853 is secured to the end of shaft 855 inside of housing 11 such that the teeth of gear 853 mesh with the teeth of gear 851. Knob 857 is fixedly attached to the end of shaft 855 outside of housing 11. Thus, mechanism 839 provides a right-angle drive train for shaft 845.

Sprocket drive mechanism 841 includes drive sprocket 865 secured to the end of shaft 845 facing toward the rear edge of bench 511 and sprocket drive chain 867 connecting sprocket 865 to sprocket 703 of actuator 655.

In accordance with the above-description of device 659 and its connection to actuator 655, clockwise rotation of knob 857 will result in positive change in slope of the axis of transducer 668, and counter-clockwise rotation of knob 857 will result in negative change in slope of the axis of transducer 668. Actuator 655 and device 659 should be connected together such that device 659 provides a zero reading when the axis of transducer 668 is parallel to axis E. As a result, the readings on scales 847, 849 will represent the slope of axis E with respect to the axis of transducer 668, such slope of axis E referred to as "SE'". The sign of SE' will be indicated in accordance with the scale giving a reading and the magnitude of SE' will be represented by the value of such reading. It should be noted that when S668 is level, the axis of transducer 668 is horizontal whereby at such time, SE' is equal to SE. Thus, when S668 is level: (1) a zero reading on indicator unit 837 will indicate that SE is zero; (2) a reading on scale 849 will indicate that SE is positive; and (3) a reading on scale 847 will indicate that SE is negative.

Top 13 of housing 11 has view windows 850, 852 disposed above scales 847, 849, respectively, so that the scales can be read from outside housing 11 (See FIG. 1).

Actuator drive indication device 661 includes indicator unit 869, knob drive mechanism 871, and sprocket drive mechanism 873.

Indicator unit 869 is identical to unit 837 of device 659 and has casing 875, drive shaft 877 and scales 879, 881 corresponding to scales 847, 849, respectively, of unit 837. Unit 869 is secured to bench 511 between actuator 657 and unit 837 such that the axis of shaft 877 is perpendicular to that of shaft 845.

Sprocket drive mechanism 873 includes drive sprocket 883 secured to the part of shaft 877 extending toward left wall 17 of housing 11, and sprocket drive chain 885 connecting sprocket 883 to sprocket 703A of actuator 657.

Knob drive mechanism 871 includes 1:1 bevel gears 871A, 871B, shaft 871C and knob 871E. Gear 871A is secured adjacent sprocket 883 to the extreme end of shaft 877. Shaft 871C extends through shaft support 871D, which is attached to bench 511, and left wall 17 of housing 11 and is rotatably secured therein such that the axis of shaft 871C is parallel to and spaced to one side of shaft 877. Gear 871B is secured to the end of shaft 871C inside of housing 11 such that the teeth of gear 871B mesh with the teeth of gear 871A. Knob 871E is fixedly attached to the end of shaft 871C outside of housing 11. Thus, mechanism 871 provides an angular direction reversing drive train for shaft 877.

In accordance with this description of device 661 and its connection to actuator 657, counterclockwise rotation of knob 871E will result in positive change in slope of the axis of transducer 668A and clockwise rotation of knob 871E will result in negative change in slope of the axis of transducer 668A. Actuator 657 and device 661 should be connected together such that device 661 provides a zero reading when the axis of transducer 668A is parallel to axis F. As a result, the readings on scale 879, 881 will represent the slope of axis F with respect to the axis of transducer 668A, such slope of axis F referred to as "SF'". The sign of SF' will be indicated in accordance with the scale giving a reading and the magnitude of SF' will be represented by the value of such reading. It should be noted that when S668A is level, the axis of transducer 668A is horizontal whereby, at such time, SF' is equal to SF. Thus, when S668A is level: (1) a zero reading on indicator unit 869 will indicate that SF is zero; (2) a reading on scale 881 will indicate that SF is positive; and (3) a reading on scale 879 will indicate that SF is negative.

Top 13 of housing 11 has view windows 880, 882 (see FIG. 1) disposed above scales 879, 881, respectively, so that the scales can be read from outside housing 11. (See FIG. 1) Level actuators 655, 657 and actuator drive and indication device 659, 661 may be mounted on a platform parallel to, spaced above and secured to bench 511 so that the scales of the indication devices will be adjacent windows 850, 852, 880, 882.

Circuitry 663 comprises two substantially identical motor-drive circuits 888. Each motor-drive circuit 888 is connected to the terminals of one or the other of transducers 668, 668A and provides a d-c output of varying polarity across two output terminals; more specifically, each motor-drive circuit provides a d-c output of one polarity when the transducer connected to the circuit has a positive slope, a d-c output of the opposite polarity when such transducer has a negative slope, and a zero output when the axis of such transducer is parallel to the horizontal plane, that is, when such transducer is "level".

Referring to FIG. 12, the preferred embodiment of each motor-drive circuit 888 includes excitation voltage generator 889, bridge 891, comparator 893 and amplifier 895.

Bridge 891 includes a plurality of resistances to which the potentiometer of one of the transducers is connected such that the first and second resistance are two resistances in a series of voltage dividers all excited by a common excitation signal.

Generator 889 is connected to bridge 891 and provides the common excitation signal for the voltage dividers of bridge 891. In order to avoid polarization of the electrolyte of the electrolytic potentiometer of the transducer, the output signal of generator 889 is a-c with no substantial d-c component.

Comparator 893 is connected to the outputs of the voltage dividers of bridge 891 and includes circuitry for comparing the voltages of such outputs and providing a variable polarity d-c output based on the comparison. The configuration of comparator 893 and the configuration of bridge 891 should correspond to one another such that the output of comparator 893 is zero when the first resistance equals the second resistance, has one polarity when the first resistance is greater than the second resistance, and has the opposite polarity when the second resistance is greater than the first resistance. In view of the a-c nature of the excitation voltage, the output voltages of bridge 891 will be a-c. Depending on the comparison circuitry of comparator 893, comparator 893 may further include rectification and filtering means for converting the output voltages of bridge 891 to substantially d-c voltages.

Amplifier 895 is connected to the output of comparator 893 and includes power amplification circuitry for amplifying the output of comparator 893 so that such output can drive the electric motors of the motor/drive units of the support mechanism. Depending on the configuration of the power amplification circuitry of amplifier 895, the output of amplifier 895 may have a polarity reversed from the output of comparator 893.

It should be noted that any of a wide variety of specific component arrangements may be used to perform the desired purposes of the motor-drive circuit in accordance with the preferred embodiment described above. One component arrangement, however, has been found to provide especially efficient and accurate results. This arrangement is shown in FIG. 12 and will be described in terms of specific component interconnections and specific component values and types. It will be appreciated, however, that the specific interconnections or component values or types can be varied somewhat without departing from the spirit of the particularly desirable component arrangement set forth.

In order to facilitate the description of motor-drive circuits 888, it will be understood that such circuit is connected to a 12 VDC source of power, the actual connections described infra in conjunction with FIG. 13. In FIG. 12, connections to the positive side of such source of power are referenced as "$V_{cc}$" and connections to the negative side of such source are referenced either with a ground symbol or by "GND". In this regard, it should be noted that the circuit of FIG. 12 includes various integrated components including digital inverters, differential comparators, D-type flip-flops and amplifiers illustrated by appropriate symbols. Each of these components are connected to $V_{cc}$ and ground in accordance with the particular circuitry, such as the type of integrated circuit, employed. Because such connections vary widely, the precise connections are not shown in FIG. 12. Where specific component types are identified, however, precise pin connection for $V_{cc}$ and ground will be described.

Generator 889 includes the following components:

| Component | Reference No. | Preferred Type Or Value |
|---|---|---|
| Inverter | 903 | 1/6 CD4069UB |
| Inverter | 904 | 1/6 CD4069UB |
| Inverter | 905 | 1/6 CD4069UB |
| Inverter | 906 | 1/6 CD4069UB |
| Inverter | 907 | 1/6 CD4069UB |
| Inverter | 908 | 1/6 CD4069UB |
| Capacitor | 909 | 470 pfd. |
| Capacitor | 911 | 10 mfd. |
| Resistor | 913 | 100 Kohm |
| Resistor | 914 | 100 Kohm |

(Note: For CD4069UBM, $V_{cc}$ is connected to pin 14 and ground is connected to pin 7. This gives power to all inverters.) The interconnection of these components is as follows: the input of inverter 903 is connected to one side of resistor 913. The output of inverter 903 is connected to the input of inverter 904. The output of inverter 904 is connected to the input of inverter 905 and to one side of capacitor 909. The output of inverter 905 is connected to each of the inputs of inverters 906–908 and to one side of resistor 914. The outputs of inverters 906–908 are all connected to one side of capacitor 911. The other side of the capacitor constitutes the output 01 of generator 839 and is connected to bridge 891 as described infra. The side of resistor 913 not connected to inverter 903, the side of resistor 914 not connected to inverter 905, and the side of capacitor 909 not connected to inverter 904 are all connected together.

In accordance with the FIG. 12 configuration of generator 889, when power is supplied to the inverters, generator 889 will self-start and will provide a square-wave a-c signal having substantially no d-c component at output 01. When the component types and values designated are used, the peak values of the square-wave signal will be approximately ±2.5 volts and the frequency of the signal will be approximately 1 Khz.

Bridge 891 includes the following components:

| Component | Reference No. | Preferred Value |
|---|---|---|
| Resistor | 917 | 1 Kohm |
| Resistor | 919 | 1 Kohm |
| Resistor | 921 | 1 Kohm |

(Note: Resistors 919 and 921 should be equal to one another within 1% tolerance.) One side of resistor 917 is the excitation signal input of bridge 891 and is connected to the side of capacitor 911 that constitutes output 01 of generator 889. The other side of resistor 917 is connected to one side of resistor 919 and to one side of resistor 921. The other side of resistors 919, 921 constitute outputs 02, 03, respectively, of bridge 891.

Referring to FIG. 13, potentiometer 793 is connected to bridge 891 of one of the motor-drive circuits 888 as follows: terminal 825 is connected to 02; terminal 827 is connected to 03; and terminal 829 is connected to ground. Potentiometer 793A is connected to bridge 891 of the other motor-drive circuit 888 as follows: terminal 825A is connected to 02; terminal 827A is connected to 03; and terminal 829A is connected to ground. The wires connecting the motor drive circuits to potentiometers 793, 793A extend through passages 810, 810A, respectively. In accordance with this configuration, for each motor-drive circuit, the voltage at 02 constitutes the divided voltage of a first voltage divider comprising the series combination of resistors 917, 919 on the high side of the divider and the first resistance of one of the transducers on the low side of the divider. The voltage at 03 constitutes the divided voltage of a second voltage divider comprising the series combination of resistors 917, 921 on the high side of the divider and the second resistance of such transducer on the low side of the divider. The output signal of generator 889 is the voltage divided by both voltage dividers. Thus, the signals at 02 and 03 will be squarewaves of the same frequency as the signal at 01 with the peak values varying in accordance with the slope of the axis of the transducer connected to the motor-drive circuit. More specifically, when such slope is level, the peak values of the signals at 02, 03 will be equal. When such slope is negative, the first resistance will be greater than the second resistance and the peak values of the signal at 02 will be less than those of the signal at 03. When such slope is positive the first resistance will be less than the second resistance and the peak values of the signal at 02 will be greater than those at 03. The signals at 02 and 03, however, will be in phase and will have substantially equal peak-to-peak transition times, such transition times being substantially equal to those of the signal at 01.

Comparator 893 includes the following components:

| Component | Reference Number | Preferred Type or Value |
|---|---|---|
| Differential Comparator | 923 | 3290 |
| Differential Comparator | 925 | 3290 |
| D-Type Flip-Flop | 927 | ¼4093 |
| D-Type Flip-Flop | 929 | ¼4093 |
| Diode | 931 | IN 914 |
| Diode | 933 | IN 914 |
| Capacitor | 935 | 1.5 mfd |
| Capacitor | 937 | 1.5 mfd |
| Resistor | 939 | 1 Mohm |
| Resistor | 941 | 1 Mohm |
| Resistor | 943 | 10 Kohm |
| Capacitor | 945 | 2.2 pfd |
| Resistor | 947 | 10 Kohm |
| Resistor | 949 | 20 Kohm |
| Capacitor | 951 | 2.2 pfd |
| Resistor | 953 | 10 Kohm |
| Resistor | 955 | 10 Kohm |
| Resistor | 957 | 10 Kohm |

(Note: for the 3290 chips, $V_{cc}$ is connected to pin 8 and ground is connected to pin 4. For the 4013 chip, $V_{cc}$ is connected to pin 14 and ground is connected to pin 7.) The anode of diode 933 is connected to output 02 of bridge 891 and to one side of resistor 943. The cathode of diode 933 is connected to one side of resistors 941, 953 and to one side of capacitor 937. The other side of capacitor 937 and resistor 941 are connected to ground. The anode of diode 931 is connected to output 03 of bridge 891 and to one side of resistor 949. The cathode of diode 931 is connected to one side of resistors 939, 947 and to one side of capacitor 935. The other side of capacitor 935 and resistor 939 are connected to ground.

The other side of resistor 943 is connected to the positive input of comparator 923 and to one side of capacitor 945. The other side of capacitor 945 is connected to the output of comparator 923, to one side of resistor 955, to the D input flip-flop 927 and to the clock ("C") input of flip-flop 929. The other side of resistor 955 is connected to $V_{cc}$. The other side of resistor 947 is connected to the negative input of comparator 923.

The other side of resistor 949 is connected to the positive input of comparator 925 and to one side of capacitor 951. The other side of capacitor 951 is connected to the output of comparator 925, to one side of resistor 957, to the D input of flip-flop 929 and to the clock input of flip-flop 927. The other side of resistor 957 is connected to $V_{cc}$. The other side of resistor 953 is connected to the negative input of comparator 925.

The set and reset inputs of flip-flops 927, 929 are all connected to ground. The Q outputs of flip-flops 927, 929 constitute outputs 04, 05, respectively, of comparator 893.

In accordance with the above-described configuration of comparator 893, comparators 923, 925 have the characteristics of a Schmitt-trigger circuit wherein a logical high output is provided when a signal voltage is above a reference voltage and a low output is provided when the signal voltage is below the reference voltage. In the configuration of comparator 893 as shown and described, the signal voltage is applied to the positive inputs of comparators 923, 925 and the reference voltage is applied to the negative inputs of comparators 923, 925.

Thus, for comparators 923, the signal voltage is the a-c signal at output 02 and the reference voltage is a substantially d-c signal resulting from rectification and a-c filtering of the a-c signal at output 03, such rectification and filtering being accomplished by diode 931 and capacitor 935, respectively. Therefore, the level of the reference voltage of comparator 923 is directly related to the positive peak voltage of the signal at output 03. In this regard, resistor 939 provides a bleed-off path for the charge on capacitor 935 so that the reference voltage of comparator 923 decreases as the positive peak voltage of the signal at output 03 decreases. For comparator 925, the signal voltage is the a-c signal at output 03 and the reference voltage is a substantially d-c signal resulting from rectification and a-c filtering of the a-c signal at output 02, such rectification and filtering being accomplished by diode 933 and capacitor 937, respectively. Therefore, the level of the reference voltage of comparator 925 is directly related to the positive peak voltage of the signal at output 02. In this regard, resistor 941 provides a bleed-off path for the charge on capacitor 937 so that the reference voltage of comparator 925 decreases as the positive peak voltage of the signal at output 02 decreases.

As a result, for each motor-drive circuit when the peak values of the signals at 02, 03 are equal, i.e., when the transducer connected to such motor-drive circuit is level, comparators 923, 925 will both provide positive-going logic pulses of equal periods at their outputs, the pulses being in phase. When the peak value of the signal at 02 is greater than that at 03, i.e., when the slope of the axis of the transducer connected to such circuit is negative, comparators 923, 925 will provide positive-going logic pulses at their outputs, the period of the pulse at the output of comparator 923 beginning before that of the pulse at the output of comparator 925 and ending after that of the pulse at the output of comparator 925. Conversely, when the peak value of the signal at 03 is greater than that at 02, i.e., when the slope of the axis of the transducer connected to such circuit is positive, comparators 923, 925 will provide positive-going logic pulses at their outputs, the period of the pulse at the output of comparator 923 beginning after that of the pulse at the output of comparator 925 and ending before that of the pulse at the output of comparator 925.

It has been found that with D-type flip-flops 927, 929 connected to such comparator outputs in the manner indicated, 04 and 05 are both low when the peak values of 02 and 03 are equal, 04 is high and 05 is low when the peak value of 02 is greater than that of 03, and 04 is low and 05 is high when the peak value of 02 is less than that of 03.

Amplifier 895 of FIG. 12 includes the following components:

| Component | Reference No. | Preferred Type or Value |
|---|---|---|
| Amplifier | 959 | uA759HC |
| Amplifier | 961 | uA759HC |
| Diode | 963 | IN914 |
| Diode | 965 | IN914 |
| Resistor | 967 | 100 Kohm |
| Resistor | 969 | 100 Kohm |
| Resistor | 971 | 100 Kohm |
| Resistor | 973 | 100 Kohm |
| Capacitor | 975 | .01 Mfd at 100 VDC |

(Note: for uA759HC, $V_{cc}$ is connected to pin 7 and ground is connected to pin 4). The interconnection of these components is as follows: The non-inverting inputs of amplifiers 959, 961 are connected to 04 and 05, respectively, of comparator circuit 893. The inverting input of amplifier 959 is connected to one side of resistor 967 and to one side of resistor 969. The other side of resistor 967 is connected to ground and the other side of resistor 969 is connected to the output of amplifier 959. The inverting input of amplifier 961 is connected to one side of resistor 971 and to one side of resistor 973. The other side of resistor 971 is connected to ground and the other side of resistor 973 is connected to the output of amplifier 961. The output of amplifier 959 constitutes output 06 of amplifier circuit 895 and is further connected to the cathode of diode 963 and to one side of capacitor 975. The output of amplifier 961 constitutes output 07 of amplifier circuit 895 and is further connected to the cathode of diode 965 and to the other side of capacitor 975. The anodes of diodes 963, 965 are connected to ground.

Outputs 06 and 07 together constitute the output of the motor-drive circuit. In accordance with the configuration of amplifier circuit 895 shown in FIG. 12 and described above, when 04 and 05 are both low, i.e., when the slope of the axis of the transducer connected to such motor-drive circuit is level, 06 and 07 will have an equal potential with respect to ground whereby the output of the motor-drive circuit will be zero. When 04 is high and 05 is low, i.e., when the slope of the axis of the transducer connected to such motor-drive circuit is negative, the potential at 06 will be greater than that at 07 with respect to ground whereby the output of the motor-drive circuit will be apotential of a first polarity. When 04 is low and 05 is high, i.e., when the slope of the axis of the transducer connected to such motor-drive circuit is positive the potential at 06 will be less than that at 07 with respect to ground whereby the output of the motor-drive circuit will be a potential of a second polarity opposite that of the first polarity. For the amplifier circuit shown and described, the magnitude of the potential will be approximately 12 VDC for both polarities.

As illustrated in FIG. 13, outputs 06 and 07 of the motor-drive circuit connected to potentiometer 793 are connected to terminal posts 371, 373, respectively, of terminal unit 367. This interconnection includes wires extending from circuit board 664 through passages 115 and 242 into housing unit 215. In accordance with the terminology used in this application and the operation of the motor-drive circuit described above, it can be seen that (1) when S668 is level, a zero potential is applied to terminal unit 367; (2) when S668 is positive, a positive potential is applied to terminal unit 367; and (3) when S668 is negative a negative potential is applied to terminal unit 367.

Outputs 06 and 07 of the other motor-drive circuit are connected to terminals 379, 381, respectively. Thus, (1) when S668 is level, a zero potential is applied to terminal unit 369; (2) when S668 is positive a positive potential is applied to terminal unit 369; and (3) when S668A is negative, a negative potential is applied to terminal unit 369.

6. Power Supply System

Power is supplied to the preferred embodiment of the apparatus of the invention by an external 12 VDC power supply through connector 127. Most commercial laser beam sources, such as the Model 80-T5 laser tube of coherent radiation, require an input voltage of several thousand volts, the power supply system of the preferred embodiment of the apparatus of the invention includes DC-DC power source 1201 for converting 12 VDC to the voltage necessary to power the laser beam source. (See FIG. 2B). Source 1201 includes positive input terminal 1203, negative input terminal 1205, positive output terminal 1207 and negative output terminal 1209.

The power supply system further includes a wiring system for connecting connector 127 to connectors 129, 131, power supply 1201 and the motor-drive circuits such that 12 VDC power can be supplied to such components and circuits by closing switch 151 and disconnected from such components and circuits by opening switch 151. Thus, referring to FIG. 13, terminal 127A, to which the positive side of the external 12 VDC supply is connected, is connected to terminal lug 155 of switch 151. Terminal lug 157 of switch 151 is connected to terminal 129A of connector 129, terminal 131A of connector 131, terminal 1203 of source 1203 and $V_{cc}$ of both motor-drive circuits 888. Terminal 127B is connected to terminals 129B, 131B, 1205 of connectors 129, 131 and source 1201, respectively, and to GND of both motor-drive circuits 888. Terminals 1207, 1209 of source 1201 are connected to terminals 532, 534, respectively of tube 531.

7. Overall Operation

Operation of the apparatus of the preferred embodiment of the invention as described supra includes the initial steps of placing the apparatus on a substantially planar, fixedly-oriented support surface as set forth in the description of the support mechanism, and connecting a 12 VDC source to connector 127 and closing switch 151. This will activate tube 531 thus generating an undeviated beam directed from knob 609 and a deviated beam directed from one of passages 31 of top 13, 67 of left wall 17, or 107 of right wall 19 depending on the position of beam splitting device 549. In all cases, the deviated beam will be perpendicular to the undeviated beam.

In order to establish two reference lines, as opposed to reference planes, all beacon units and adaption plate 1113 are removed from housing 11.

If, for the particular use, two substantially horizontal reference lines are desirable, knob 609 can be turned to its extreme clockwise position, viewing housing 11 from the rear, so as to direct the deviated beam to the left ("left-directed beam"), or turned to its extreme counter-clockwise position so as to direct the deviated beam to the right ("right-directed beam"). If, instead, a substantially horizontal reference line and a substantially vertical reference line are desirable, knob 609 should be turned to its center locked position so as to direct the deviated beam up ("up-directed beam"). It should be noted that in accordance with the foregoing, no movement of housing 11 is required, although three different sets of reference lines are provided. Furthermore, the direction of the undeviated beam remains constant while the direction of the deviated beam is changed.

The direction of the substantially horizontal reference lines provided as described above may be adjusted by turning knob 428 of rear support unit 163 as set forth in the description of the support mechanism. Thus, as knob 428 is rotated clockwise, the undeviated beam will rotate counter-clockwise (viewing housing 1 from above) about axis C; as knob 428 is rotated counter-clockwise, the undeviated beam will rotate clockwise about axis C. If, during such adjustment of knob 428, the deviated beam is directed left or right, such beam will rotate in the same direction as the undeviated beam rotates while maintaining a perpendicular relationship to the undeviated beam.

In addition, when the 12 VDC source is connected to connector 127 and switch 151 is closed, power will be supplied to the motor-drive circuits. Thus, depending on S668 and S668A, voltage potentials may be applied to terminal units 367, 369 in accordance with the operation of the level control mechanism as set forth supra. As set forth in the description of the support mechanism and illustrated in Table 1, such potentials, if they exist, will cause SE and/or SF to increase and/or decrease. The nature of the relationship among S668, S668A and changes in SE and SF can be illustrated by applying the operation of the level control mechanism to Table 1. In this regard, in accordance with the configuration of the motor-drive circuit described supra, the magnitude of all non-zero potentials applied to terminal units 367, 369 will be substantially equal. Therefore, the conditions illustrated in Table 1 for which neither P369 nor P367 is zero and the magnitudes of the potential are not equal to one another need not be considered. Thus, Table 2 can be used as a general guide for illustrating the relationships among S668, S668A to changes in SE, SF.

TABLE 2

| S668 | S668A | SE | SF |
|---|---|---|---|
| level | level | NC | NC |
| level | negative | decrease | increase |
| level | positive | increase | increase |
| negative | level | increase | decrease |
| negative | negative | NC | increase |
| negative | positive | increase | NC |
| positive | level | decrease | decrease |
| positive | negative | decrease | NC |
| positive | positive | NC | decrease |

Assuming that knobs 857, 871E are not adjusted while SE and SF are changing S668, S668A will change in direct correspondence to changes in SE and SF. In accordance with the operation set forth in Table 2 and taking into account mechanical and electrical limitations of the support mechanism and level control mechanism, the changes in SE and SF generally will tend to make S668 and S668A level. As indicated in Table 2 when S668 and S668A are both level, there will be no further changes in SE or in SF at which time the apparatus will be "fixed."

As further indicated in the description of the level control mechanism, when S668 and S668A are both level, the readings on the scales of indicator units 837, 869 represent SE, SF respectively. Because the undeviated beam is coincident with axis F, when the apparatus is fixed, the reading on the scales of indicator unit 869 represents the slope of the undeviated beam; e.g., a reading of zero indicates that the undeviated beam is horizontal (has no slope), a reading on scale 879 indicates that the undeviated beam slopes downwardly moving from housing 11 (negative slope), and a reading on scale 881 indicates that the undeviated beam slopes upwardly moving from housing 11 (positive slope). Similarly, because a right-directed beam and a left-directed beam is coincident with axis E when the apparatus is fixed, the reading on the scales of indicator unit 837 represents the slope of a left or right-directed beam; e.g., a reading of zero indicates that the left or right-directed beam has no slope, a reading on scale 847 indicates that a left-directed beam has a positive slope or that a right directed beam has a negative slope, and a reading on scale 849 indicates that a left-directed beam has a negative slope or that a right-directed beam has a positive slope. In all cases, when the apparatus is fixed, the degree of slope is represented by the value of the reading, each value corresponding to a particular degree of slope.

Because an up-directed beam is perpendicular to both axis E and axis F, when the apparatus is fixed, the readings on the scales of indicator units 837, 869 will represent the degree of deviation of the up-directed beam from the vertical in two components; e.g. the reading on the scales of indicator unit 837 will indicate the component of deviation in the direction axis E ("E component of deviation") and the reading on the scales of indicator unit 869 will indicate the component of deviation in the direction of axis F ("F component of deviation"). Thus, if both indicator units have a zero reading, the up-directed beam will be vertical. The degree of the E component of deviation will be represented by the value of the reading of indicator unit 837 and the degree of the F component of deviation will be represented by the value of the reading of indicator unit 869.

Thus, the slope of the undeviated beam and the F component of deviation of the up-directed beam can be set as desired by turning knob 871E until the reading corresponding to the desired slope or deviation is shown on scales 879, 881 of indicator unit 869 and the slope of the left or right-directed beam or the E component of deviation of the up-directed beam can be set as desired by turning knob 857 until the reading corresponding to the desired slope or deviation is shown on scales 847, 849 of indicator unit 837. Immediately upon such adjustment of either or both of knobs 857, 871E, the apparatus will adjust itself in accordance with Table 2 until the apparatus is fixed, at which time the slopes and/or deviations of the beams will be set as desired.

Thus, once the apparatus has been placed on a surface at a particular reference point or location, a pair of orthogonal reference lines in the form of light beams can be established and their direction, slope and/or deviation adjusted without repositioning the apparatus, but merely by turning one or more of knobs 428, 609, 857, 871E. Once the beams have been set as desired, they may be used to establish orientational relationships of surfaces and structured components and to position equipment according to methods well-known in the art.

8. Summary

Although the circuit described in detail supra has been found to be most satisfactory and preferred, many variations in structure are possible. Because many varying and different embodiments may be made within the scope of the inventive concept herein taught, and because many variations may be made in the embodiment herein detailed in accordance with the descriptive requirements of the law, it should be understood that the details herein are to be interpreted as illustrative and not in a limiting sense.

What is claimed as invention is:

1. A circuit for comparing the amplitude of a first alternating current signal to the amplitude of a second alternating current signal, such first and second alternating current signals being in phase with one another and having the same frequency, the circuit comprising:

first filter means for rectifying and filtering such first alternating current signal so as to provide a substantially direct current first signal having a voltage level directly proportional to the amplitude of such first alternating current signal;

second filter means for rectifying and filtering such second alternating current signal so as to provide substantially direct current and having a voltage level directly proportional to the amplitude of such second alternating current signal;

first comparison means for providing a first comparison signal, said first comparison signal including a first comparison pulse whenever the amplitude of such first alternating current signal becomes greater than the voltage level of said second filtered signal, each said first comparison pulse beginning at the time such first alternating signal becomes greater than the voltage level of said second filtered signal and ending when said first alternating signal becomes less than the voltage level of said second filtered signal;

second comparison means for providing a second comparison signal, said second comparison signal including a second comparison pulse whenever the amplitude of such second alternating current signal becomes greater than the voltage level of said first filtered signal, each said second comparison pulse beginning at the time such second alternating current becomes greater than the voltage level of said first filtered signal and ending when such second alternating current signal becomes less than the voltage level of said first filtered signal; and output means for providing an output signal having a first value whenever said first comparison pulses are wider than said second comparison pulses, a second value whenever said second comparison pulses are wider than said first comparison pulses and a third value whenever said first comparison pulses have the same width as said second comparison pulses.

2. A circuit for driving a motor in response to the slope of a gravity-sensing transducer, such transducer having a first resistance and a second resistance, such first resistance being equal to such second resistance when such transducer is level, such first resistance being greater than such second resistance when the transducer has a non-zero slope of a first polarity and such second resistance being greater than such first resistance when the transducer has a non-zero slope of a second polarity opposite said first polarity, and such second resistance being substantially equal to such first resistance whenever the transducer has a zero slope, the circuit comprising:

signal generation means for generating an alternating current excitation signal;

bridge means for providing a first and a second bridge output signal, said bridge means being excited by said excitation signal and being connected to such transducer such that said first bridge output signal is related to the first resistance of such transducer in a first proportion and said second bridge output signal is related to the second resistance of such transducer in the first proportion; and comparison means for comparing the amplitude of said first bridge output signal to the amplitude of said second bridge output signal and providing an output voltage having a first polarity whenever the amplitude of said first bridge output signal is greater than the amplitude of said second bridge output signal, a second polarity whenever the amplitude of said second bridge output signal is greater than said first bridge output signal and being substantially zero whenever the amplitude of said first output signal equals the amplitude of said second output signal, said comparison means including pulse generation means for generating a first pulse signal and a second pulse signal, said first pulse signal including a series of first pulses and said second pulse signal including a series of second pulses, said first pulses being wider than said second pulses whenever the amplitude of said first bridge output signal is greater than the amplitude of said second bridge output signal, being narrower than said second pulses whenever the amplitude of said second bridge output signal is greater than the amplitude of said first bridge output signal and having the same width as said second pulses whenever the amplitude of said first bridge output signal is equal to the amplitude of said second bridge output signal.

3. A circuit for comparing the relative resistances of a first and a second resistor, the circuit comprising:

signal generation means for generating an alternating current excitation signal;

bridge means for providing a first and a second bridge output signal, said bridge means being excited by said excitation signal and being connected to such first and second resistors such that said first bridge output signal is related to the resistance of such first resistor in a first proportion and said second bridge output signal is related to the resistance of such second resistor in the first proportion; and comparison means for comparing the amplitude of said first bridge output signal to the amplitude of said second bridge output signal and providing an output voltage having a first polarity whenever the amplitude of said first bridge output signal is greater than the amplitude of said second bridge output signal, a second polarity whenever the amplitude of said second bridge output signal is greater than said first bridge output signal and being substantially zero whenever the amplitude of said first output signal equals the amplitude of said second output signal, said comparison means including pulse generation means for generating a first pulse signal and a second pulse signal, said first pulse signal including a series of first pulses and said second pulse signal including a series of second pulses, said first pulses being wider than said second pulses whenever the amplitude of said first bridge output signal is greater than the amplitude of said second bridge output signal, being narrower than said second pulses whenever the amplitude of said second bridge output signal is greater than the amplitude of said first bridge output signal and having the same width as said second pulses whenever the amplitude of said first bridge output signal is equal to the amplitude of said second bridge output signal.

* * * * *